(12) United States Patent
Park et al.

(10) Patent No.: US 10,818,854 B2
(45) Date of Patent: Oct. 27, 2020

(54) FLEXIBLE ORGANIC LIGHT EMITTING DISPLAY DEVICE

(71) Applicant: LG Display Co., Ltd., Seoul (KR)

(72) Inventors: Jinho Park, Goyang-si (KR); Sanggun Lee, Uijeongbu-si (KR); Donghyeok Lim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/101,062

(22) Filed: Aug. 10, 2018

(65) Prior Publication Data
US 2019/0207132 A1   Jul. 4, 2019

(30) Foreign Application Priority Data
Dec. 29, 2017   (KR) .......................... 10-2017-0184679

(51) Int. Cl.
*H01L 51/52*   (2006.01)
*H01L 51/00*   (2006.01)
(Continued)

(52) U.S. Cl.
CPC ........ *H01L 51/0097* (2013.01); *H01L 51/504* (2013.01); *H01L 51/5056* (2013.01);
(Continued)

(58) Field of Classification Search
CPC ............... H01L 51/504; H01L 51/5265; H01L 51/5072; H01L 51/524; H01L 51/5056;
(Continued)

(56) References Cited

U.S. PATENT DOCUMENTS

2009/0053557 A1*   2/2009   Spindler ............. H01L 51/0058
                                                            428/690
2014/0138636 A1*   5/2014   Song ................... H01L 51/5262
                                                            257/40
(Continued)

FOREIGN PATENT DOCUMENTS

KR   10-2014-0080235 A   6/2014
KR   10-2014-0085243 A   7/2014
KR   10-2015-0017969 A   2/2015

OTHER PUBLICATIONS

Young. Hugh D. and Freedman Roger A, University Physics, Pierson, 12-th Edition; pp. 1104-1105 (Year: 2008).*
(Continued)

*Primary Examiner* — Erik T. K. Peterson
*Assistant Examiner* — Pavel G Ivanov
(74) *Attorney, Agent, or Firm* — Seed Intellectual Property Law Group LLP

(57) ABSTRACT

In a flexible organic light-emitting display device according to the present disclosure, an organic sealing film having a refractive index at least 0.3 smaller than a refractive index of each of first and second inorganic sealing films is disposed between the first and second inorganic sealing films, and, at the same time, a thickness of a front sealing layer is optimized to be less than 10 micrometers inclusive. Thus, the refractive index difference between the organic capping layer and the inorganic capping layer may be maximized to increase the micro-cavity effect. Further, by increasing the refractive index difference and optimizing the thickness in the front sealing layer, the micro-cavity effect may further be increased and, hence, the light extraction efficiency may be maximized.

15 Claims, 16 Drawing Sheets

(51) Int. Cl.
*H01L 51/50* (2006.01)
*H01L 27/32* (2006.01)

(52) U.S. Cl.
CPC ...... *H01L 51/5072* (2013.01); *H01L 51/5092* (2013.01); *H01L 51/5203* (2013.01); *H01L 51/524* (2013.01); *H01L 51/5256* (2013.01); *H01L 51/5265* (2013.01); *H01L 51/5275* (2013.01); *H01L 27/3244* (2013.01); *H01L 51/008* (2013.01); *H01L 2251/5338* (2013.01)

(58) Field of Classification Search
CPC ............. H01L 51/5275; H01L 51/5092; H01L 51/5203; H01L 51/008; H01L 27/3244; H01L 27/3211; H01L 51/5253
See application file for complete search history.

(56) References Cited

U.S. PATENT DOCUMENTS

| | | | | |
|---|---|---|---|---|
| 2015/0144890 A1* | 5/2015 | Ma | ...................... | H01L 51/5275 257/40 |
| 2018/0019439 A1* | 1/2018 | Lee | ...................... | H01L 27/3262 |
| 2019/0211219 A1* | 7/2019 | Kondo | ................. | C09D 11/322 |

OTHER PUBLICATIONS

O. S. Heavens, Optical properties of thin solid films, Dover Publications, Inc., pp. 207-219 (Year: 1991).*

K. K. Sharma, Optics Principles and Applications, Elsevier Inc., pp. 22-42 (Year: 2006).*

* cited by examiner

FLEXIBLE ORGANIC LIGHT EMITTING DISPLAY DEVICE

CROSS-REFERENCE TO RELATED APPLICATION

This application claims the benefit of Korean patent application No. 10-2017-0184679 filed on Dec. 29, 2017, the entire content of which is incorporated herein by reference for all purposes as if fully set forth herein.

BACKGROUND

Technical Field

The present disclosure relates to a flexible organic light-emitting display device, and more particularly, to a flexible organic light-emitting display device in which light extraction efficiency may be improved by increasing a micro-cavity effect.

Description of the Related Art

Flat panel display devices proposed to replace CRT (cathode ray tubes) include liquid crystal displays (LCD), field emission displays, plasma display panels (PDP) and organic light-emitting diode displays (OLED).

In the organic light-emitting display device, an organic light emitting diode provided in a display panel has high luminance and low operating voltage characteristics. Further, since the organic light emitting display device is a self-light emitting type in which light is emitted by itself, the organic light emitting display device has a high contrast ratio and realizes an ultra-thin display device. Further, since the response time thereof is about several microseconds, a moving image is easy to be implemented by the organic light emitting display device. The viewing angle thereof is not limited, and stable characteristics are obtained even at low temperatures.

In order to render a color in the organic light-emitting display device, organic light emitting layers may emit red, green, and blue light beams respectively or emit white light. Each of the organic light emitting layers is formed between two electrodes to form an organic light emitting diode.

Further, in the organic light-emitting display device, a pixel region is defined by intersecting a data line to which a video signal is supplied, a gate line to which a driving signal is supplied, and a power source line to supply power to the organic light emitting diode. In this connection, the pixel region includes a switching thin film transistor, a driving thin film transistor, a storage capacitor and an organic light emitting diode. The organic light emitting diode may include a stack of an anode electrode, an organic light emitting layer, and a cathode electrode in this order.

In this connection, the organic light-emitting layer includes a hole injection layer (HIL), a hole transport layer (HTL), an emission layer (EML), an electron transport layer (ETL), and an electron injection layer (EIL).

In such an organic light emitting diode, when the holes and electrons injected into the anode and the cathode recombine in the light emitting layer (EML), an exciton is generated in an excitation process and then energy is generated from the exciton to emit light. The organic light-emitting display device displays an image by electrically controlling amount of light generated from the emission layer (EML) of the organic light emitting diode.

In the case of the organic light-emitting display device having the above-described structure, a micro-cavity structure using a capping layer is actively studied for effectively extracting light generated from the organic light-emitting layer to improve light efficiency. That is, due to a difference in a refractive index between the capping layer and an external air layer located on the capping layer, the light generated from the light emitting layer repeatedly transmits and reflects between the capping layer and the external air layer. This improves the light efficiency.

BRIEF SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure provides a flexible organic light-emitting display device that can enhance light extraction efficiency by increasing the micro-cavity effect.

To this end, in the flexible organic light-emitting display device according to the present disclosure, an inorganic capping layer having a refractive index at least 0.3 smaller than that of an organic capping layer is disposed between the organic capping layer and a front sealing layer.

Further, in a flexible organic light-emitting display device according to the present disclosure, an organic sealing film having a refractive index at least 0.3 smaller than a refractive index of each of first and second inorganic sealing films is disposed between the first and second inorganic sealing films, and, at the same time, a thickness of the front sealing layer is optimized to be less than 10 micrometers inclusive.

Accordingly, in the flexible organic light-emitting display device according to the present disclosure, the refractive index difference between the organic capping layer and the inorganic capping layer may be maximized to increase the micro-cavity effect. Further, by increasing the refractive index difference and optimizing the thickness in the front sealing layer, the micro-cavity effect may further be increased and, hence, the light extraction efficiency may be maximized.

In a first aspect of the present disclosure, there is provided a flexible organic light-emitting display device comprising: a light-emitting diode having a first electrode, an organic light-emitting layer on the first electrode, and a second electrode on the organic light-emitting layer; an organic capping layer on the second electrode of the light-emitting diode; a front sealing layer on the organic capping layer; and an inorganic capping layer disposed between the organic capping layer and the front sealing layer, wherein the organic capping layer has a first refractive index, wherein the inorganic capping layer has a second refractive index smaller than the first refractive index, wherein a difference between the first refractive index and the second refractive index is at least 0.4.

In one embodiment of the first aspect, the first refractive index is in a range of 1.8 to 2.0, and wherein the second refractive index is in a range of 1.3 to 1.5.

In one embodiment of the first aspect, the inorganic capping layer includes at least one selected from a group consisting of LiF, LiO, MgF2, NaF, CaO, KF, Bi2S3, Na5Al3F14 and SiO2.

In one embodiment of the first aspect, the front sealing layer includes: a first inorganic sealing film disposed on the inorganic capping layer; an organic sealing film disposed on the first inorganic sealing film; and a second inorganic sealing film disposed on the organic sealing film.

In one embodiment of the first aspect, each of the first and second inorganic sealing films has a third refractive index, wherein the organic sealing film has a fourth refractive index smaller than the third refractive index, wherein a difference between the third refractive index and the fourth refractive index is at least 0.3.

In one embodiment of the first aspect, the third refractive index is in a range of 1.7 to 1.9, wherein the fourth refractive index is in a range of 1.4 to 1.6.

In one embodiment of the first aspect, each of the first and second inorganic sealing films has a thickness of 0.5 to 1 wherein the organic sealing film has a thickness of 3 to 9 μm.

In one embodiment of the first aspect, the front sealing layer has a thickness of 10 μm or smaller.

In one embodiment of the first aspect, the organic sealing film includes an ultraviolet (UV)-cured white ink material.

In one embodiment of the first aspect, the ultraviolet-cured white ink material contains 30 to 45% by weight of pigment dispersion, 10 to 30% by weight monofunctional monomer, photo-initiator 1 to 10% by weight, and oligomer 5 to 15 wt % based on a total weight of the white ink material.

In one embodiment of the first aspect, the pigment dispersion contains a white pigment, a reactive monomer and a dispersant.

In one embodiment of the first aspect, the ultraviolet-cured white ink further includes at least one of a polyfunctional monomer, a polymerization inhibitor and a surfactant.

In a second aspect of the present disclosure, there is provided a flexible organic light-emitting display device comprising: an organic light-emitting diode having a first electrode, a second electrode, and an organic light-emitting stack between the first and second electrodes, organic light-emitting stack includes an electron injection layer, an electron transport layer, an organic light-emitting layer, an electron transport layer, and an electron injection layer, wherein the organic light-emitting layer includes red, green and blue light-emitting layers, wherein the blue light-emitting layer includes a host material and boron-based luminescent dopants in the host material.

In one embodiment of the second aspect, a difference between a full width at half maximum (FWHM) of a photo-luminescence (PL) distribution curve of the luminescent dopant and a full width at half maximum (FWHM) of a (out-coupling) OC distribution curve due to a cavity structure is 5 nm or smaller.

In one embodiment of the second aspect, the device further comprises an organic capping layer disposed on the second electrode of the light-emitting diode; a front sealing layer disposed on the organic capping layer, wherein a front sealing layer includes a first inorganic sealing film, an organic sealing film disposed on the first inorganic sealing film, and a second inorganic sealing film disposed on the organic sealing film; and an inorganic capping layer disposed between the organic capping layer and the front sealing layer.

In accordance with the present disclosure, the inorganic capping layer having a lower refractive index of 1.3 to 1.5 is disposed between the organic capping layer having a higher refractive index and the first inorganic sealing film of the front sealing layer having a higher refractive index. Thus, the refractive index difference between the organic capping layer and the inorganic capping layer is maximized, such that the light extraction efficiency can be improved via the increase of the micro-cavity effect.

Further, in the flexible organic light-emitting display device according to the present disclosure, the organic sealing film having the refractive index at least 0.3 smaller than the refractive index of each of the first and second inorganic sealing films is disposed between the first and second inorganic sealing films. This also increases the refractive index difference in the front sealing layer, thereby maximizing the increase of the micro-cavity effect and thus improving the light extraction efficiency.

Moreover, in a flexible organic light-emitting display device according to the present disclosure, the organic sealing film having the refractive index at least 0.3 smaller than the refractive index of each of the first and second inorganic sealing films is disposed between the first and second inorganic sealing films, and, at the same time, the thickness of the front sealing layer is optimized to be smaller or equal to 10 micrometers. In this way, by increasing the refractive index difference and optimizing the thickness in the front sealing layer, the micro-cavity effect may further be increased and, hence, the light extraction efficiency may be maximized.

Moreover, in a flexible organic light-emitting display device according to the present disclosure, the blue light-emitting layer includes the host material and boron-based luminescent dopants added to the host material. Thus, a difference between a full width at half maximum (FWHM) of a photo-luminescence (PL) distribution curve of the luminescent dopant and a full width at half maximum (FWHM) of a (out-coupling) OC distribution curve due to a cavity structure is 5 nm or smaller. Thus, the light extraction efficiency may be maximized.

DETAILED DESCRIPTION

Figure 1:
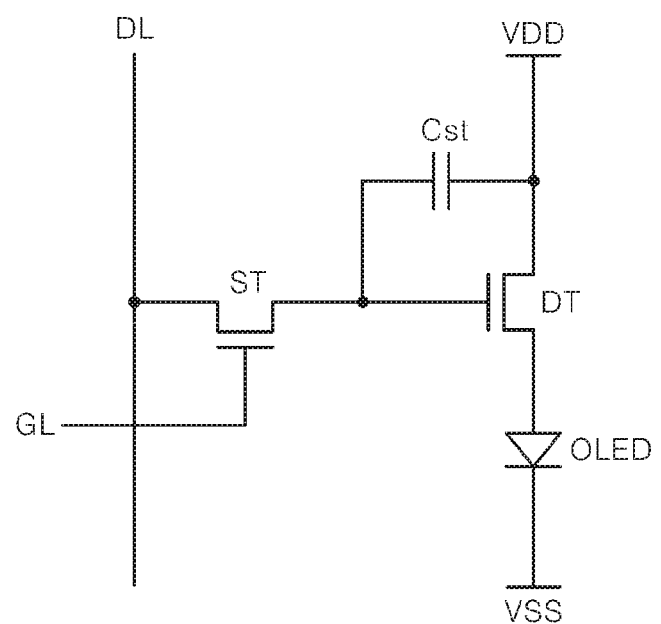
FIG. 1 is a circuit diagram showing a unit pixel of a flexible organic light-emitting display device according to a first embodiment of the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known structures and/or processes have not been described in detail in order not to unnecessarily obscure the present disclosure.

Figure 2:
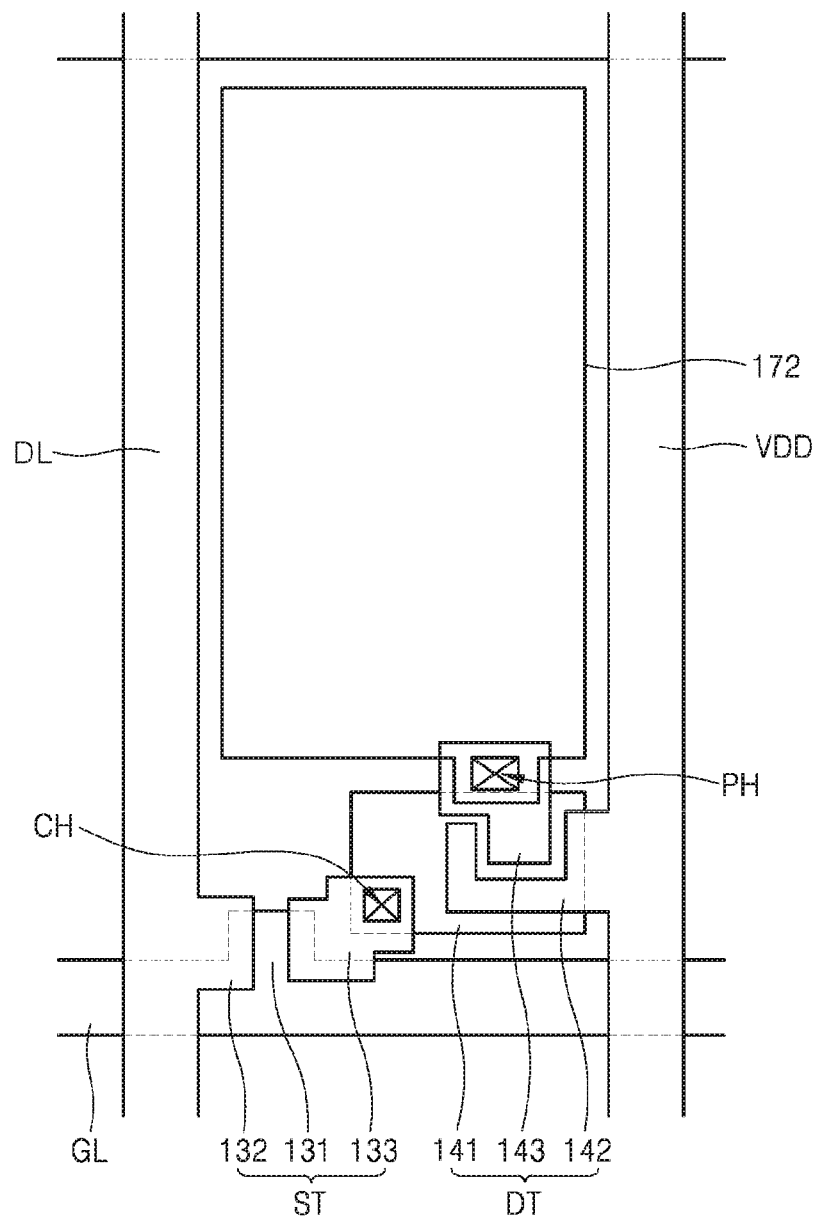
FIG. 2 is a top view of a unit pixel of a flexible organic light-emitting display device according to the first embodiment of the present disclosure.

FIG. 1 is a circuit diagram showing a unit pixel of a flexible organic light-emitting display device according to a first embodiment of the present disclosure. FIG. 2 is a top view of a unit pixel of a flexible organic light-emitting display device according to the first embodiment of the present disclosure.

Referring to FIG. 1 and FIG. 2, a flexible organic light-emitting display device according to a first embodiment of the present disclosure may include a switching transistor ST, a driving transistor DT connected to the switching transistor ST, and an organic light emitting diode OLED connected to the driving transistor DT.

The switching transistor ST is arranged in an intersection or overlap region of a gate wiring GL extending in a first direction and a data wiring DL extending in a second direction crossing the first direction. This switching transistor ST functions to select a pixel. The switching transistor ST includes a gate electrode 131 branched from the gate line GL, a semiconductor layer (not shown) overlapped with the gate electrode 131, and a source electrode 132 and a drain electrode 133 branched from the data line DL.

The driving transistor DT serves to drive the light-emitting diode OLED in the pixel as selected by the switching transistor ST. The driving transistor DT includes a gate electrode 141 connected to the drain electrode 133 of the switching transistor ST through a drain contact hole CH, a semiconductor layer (not shown) overlapped with the gate electrode 141, a source electrode 142 connected to a driving current wiring VDD, and a drain electrode 143 spaced apart from the source electrode 142. In this connection, although not shown in the drawing, the drain electrode 143 may be connected to the driving current wiring VDD, while the source electrode 142 may be spaced apart from the drain electrode 143.

In this connection, the drain electrode 143 of the driving transistor DT is electrically connected to a first electrode 172 of the light-emitting diode OLED via a pixel contact hole PH.

Figure 3:
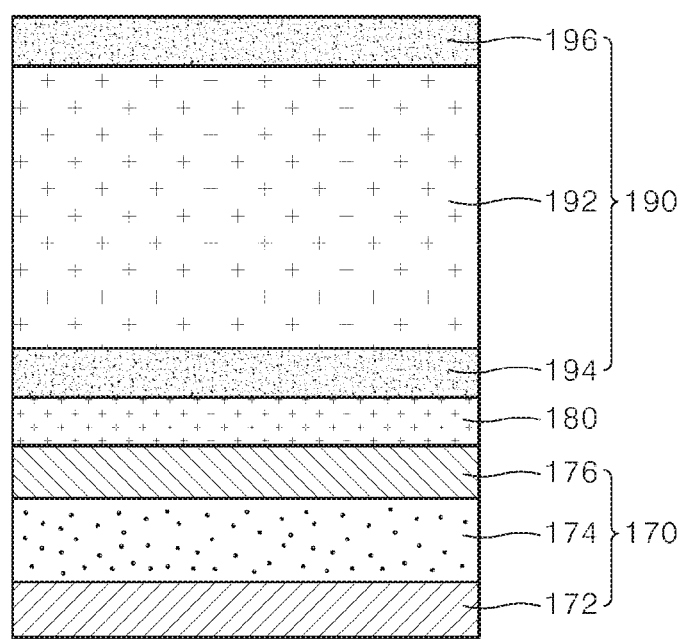
FIG. 3 is a schematic representation of a flexible organic light-emitting display device according to the first embodiment of the present disclosure.

FIG. 3 is a schematic diagram showing a flexible organic light-emitting display device according to the first embodiment of the present disclosure. In this connection, in FIG. 3, the substrate, switching transistor and driving transistor are omitted.

Referring to FIG. 3, the flexible organic light-emitting display device 100 according to the first embodiment of the present disclosure includes a light-emitting diode 170, an organic capping layer 180, and a front sealing layer 190.

The light-emitting diode 170 includes the first electrode 172, an organic light-emitting layer 174 and a second electrode 176.

The first electrode 172 may be electrically connected to the driving transistor DT, for example, shown in FIG. 2 disposed on the substrate. The first electrode 172 may be formed of a multilayer structure including a metal layer made of silver (Ag) or a silver alloy (AgNd), and a transparent layer made of a transparent conductive material such as indium tin oxide (ITO) or indium zinc oxide (IZO). In one or more embodiments, the first electrode 172 may be a reflective electrode.

The organic light-emitting layer 174 is disposed on the first electrode 172. The organic light-emitting layer 174 may include an organic light-emitting material that emits white light. For example, the organic light-emitting layer 174 may be a multi-layer structure and may include a blue organic light-emitting layer, a red organic light-emitting layer, and a green organic light-emitting layer which emit light that, in combination, results in emission of white light from the organic light-emitting layer 174. Alternatively, the organic light-emitting layer 174 may have a tandem structure including a blue light-emitting layer and a yellow-green light-emitting layer. However, the organic light-emitting layer 174 in accordance with embodiments of the present disclosure is not limited to the above structure but may include various structures.

Further, although not shown in the drawings, the light-emitting diode 170 may include an electron injection layer and a hole injection layer for injecting electrons and holes into an electron transport layer and a hole transport layer respectively; an electron transport layer and a hole transport layer for transporting the injected electrons and holes thereto to the organic light-emitting layer 174; and the light emitting layer 174 disposed between the electron transporting layer and the hole transporting layer for emitting light.

For this purpose, the light-emitting layer is preferably made of a material having good quantum efficiency for fluorescence or phosphorescence. Specifically, the light-emitting layer is made of a host and a luminescent dopant, and may include a material emitting red, green, blue or white light.

In this connection, when the light-emitting layer emits red light, the layer may include host material including CBP (carbazole biphenyl) or mCP(1,3-bis(carbazol-9-yl). The layer further includes a phosphor containing at least one light emission dopant selected from PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum), or fluorescent material including PBD:Eu(DBM) 3(Phen) and Perylene. However, the present disclosure is not limited thereto.

Further, when the light-emitting layer emits green light, the layer may include host material including CBP or mCP. The layer further includes a phosphor containing a light emission dopant including Ir(ppy)3(fac tris(2-phenylpyridine)iridium) or fluorescent material including Alq3(tris(8-hydroxyquinolino)aluminum). However, the present disclosure is limited thereto.

Further, when the light-emitting layer emits blue light, the layer may include a host material including CBP, or mCP. The layer further includes a phosphor containing a light emission dopant including (4,6-F2ppy)2Irpic or L2BD111, or a fluorescent material including at least one selected from the group consisting of spiro-DPVBi, spiro-6P, distyrylbenzene (DSB), distyrylarylene (DSA), PFO-based polymer and PPV-based polymer. However, the present disclosure is limited thereto.

The second electrode 176 is disposed on the organic light-emitting layer 174. The second electrode 176 may be embodied as a single layer or a multi-layer structure. In the latter case, each layer of the second electrode 176 may be embodied as a metal layer, an inorganic layer, a mixture layer of metals, or a mixture layer of a metal and an inorganic material, or a combination thereof. In this connection, when each layer is embodied as a mixture layer of metal and inorganic material, the mixing ratio between the metal to inorganic material may be in a range of 10:1 to 1:10. When each layer is embodied as a mixed layer of a first metal and a second metal, the mixing ratio between the first metal and the second metal may be in range of 10:1 to 1:10. The metal forming the second electrode 176 may include Ag, Mg, Yb, Li, or Ca. The inorganic material may include Li2O, CaO, LiF or MgF2. These materials help to transfer electrons to the light-emitting layer via assistance of the electron movement. The second electrode 176 may have a thickness of about 50-200 Angstroms. In particular, the second electrode 176 may be a semi-transmissive electrode having a transmittance of 20 to 50%, depending on the material, thickness and mixing ratio thereof.

In this connection, in one example, the first electrode 172 may be the anode of the light-emitting diode 170 while the second electrode 176 may be the cathode of the diode. When a voltage is applied to the first electrode 172 and the second electrode 176, electrons are injected into the organic light-emitting layer 174 from the second electrode 176, while holes are injected into the organic light-emitting layer 174 from the first electrode 172. Thus, an exciton is generated in the organic light-emitting layer 174. As the exciton decays, light corresponding to the energy difference between the LUMO (Lowest Unoccupied Molecular Orbital) of the organic light-emitting layer 174 and the HOMO (Highest Occupied Molecular Orbital) of the layer 174 may be generated. Then, the light is emitted upwardly from the second electrode 176.

The organic capping layer 180 is disposed on the second electrode 176 of the light-emitting diode 170. The organic capping layer 180 increases the light extraction effect and protects the light-emitting diode 170 from external moisture penetration and oxidation. The organic capping layer 180 may prevent separation between the light-emitting diode 170 and the front sealing layer 180. To this end, the organic capping layer 180 has a considerably thin thickness, which in some embodiments may be less than 0.1 μm.

The material of the organic capping layer 180 may be, for example, the same material as one of the host materials of the light-emitting layers emitting the red, green, and blue light beams respectively. Alternatively, the material of the organic capping layer 180 may be the same as at least one material selected from the group consisting of materials of the hole transporting layer and the electron transporting layer. However, the present disclosure is not limited thereto. In one example, the organic capping layer 180 may include CBP (carbazole biphenyl) or mCP(1,3-bis(carbazol-9-yl). In this case, the organic capping layer 180 has a refractive index of 1.8 to 2.0.

The front sealing layer 190 is disposed on the organic capping layer 180. In this connection, the front sealing layer 190 may include a first inorganic sealing film 194 disposed on the organic capping layer 180, an organic sealing film 192 disposed on the first inorganic sealing film 194, and a second inorganic sealing film 196 disposed on the organic sealing film 192.

Each of the first and second inorganic sealing films 194 and 196 may be made of aluminum oxide (AlxOx), silicon oxide (SiOx), or silicon nitride (SiNx), silicon oxy-nitride (SiON), etc. Each of the first and second inorganic sealing films 194 and 196 has a refractive index of 1.7 to 1.9 and a thickness of 1.5 μm or less. The organic sealing film 192 may be made of a polymer material such as an acrylic resin, an epoxy resin, polyimide, or polyethylene. In this case, the organic sealing film 192 has a refractive index of 1.6 to 1.8 and a thickness of 17 to 19 μm. In the flexible organic light-emitting display device 100 according to the first embodiment of the present disclosure described above, disposing the front sealing layer 190 on the organic capping layer 180 may lead to a flexible property of the device 100.

However, in the flexible organic light-emitting display device 100 according to the first embodiment of the present disclosure, in order to realize the flexibility thereof, the front sealing layer 190 should be disposed on the capping layer 180. Due to these structural constraints, the capping layer is not in contact with an external air layer. Thus, there is a problem that the light extraction efficiency is reduced due to the reduction of the micro-cavity effect.

In particular, the flexible organic light-emitting display device 100 according to the first embodiment of the present disclosure may have the efficiency of white light emission as reduced by about 20% due to the presence of the front sealing layer 190, compared to a configuration in which the capping layer is in contact with the external air layer due to the absence of the front sealing layer 190. This causes a problem of increasing power consumption in the flexible organic light-emitting display device 100 according to the first embodiment of the present disclosure. The applicant believes that this may be because a difference in a refractive index between the organic capping layer 180 and the first inorganic sealing film 194 is not large, for example, about 0.2 or less, and therefore, the micro-cavity effect is reduced.

In order to solve this problem, in a flexible organic light-emitting display device according to a second embodiment of the present disclosure, an inorganic capping layer is disposed between the organic capping layer and the front sealing layer. In this connection, a refractive index of the inorganic capping layer is smaller than that of the organic capping layer, where a difference between the refractive index of the inorganic capping layer and the refractive index of the organic capping layer is at least 0.3, and in some embodiments at least 0.4. As a result, the refractive index difference between the organic capping layer and the inorganic capping layer is maximized, and, hence, the light extraction efficiency is improved by increasing the micro-cavity effect.

This will be described in more detail with reference to the accompanying drawings.

Figure 4:
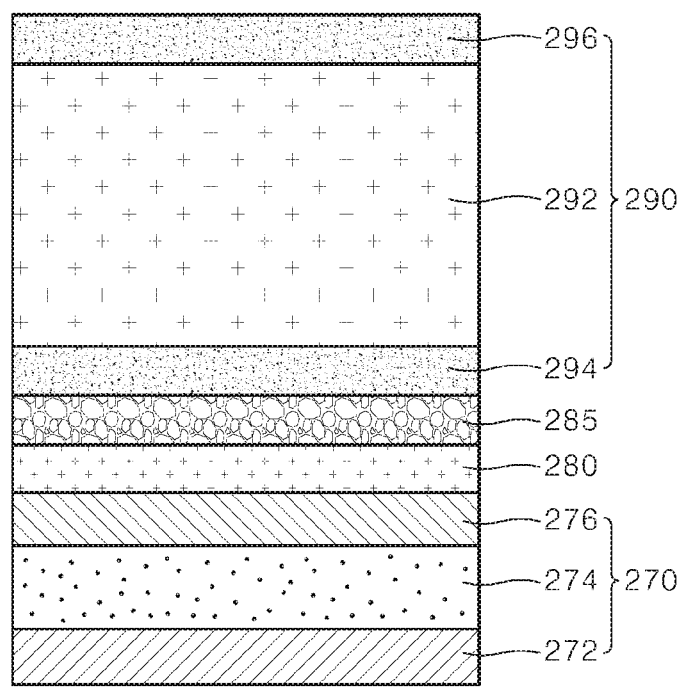
FIG. 4 is a schematic diagram of an OLED display according to a second embodiment of the present disclosure.

FIG. 4 is a schematic representation of a flexible organic light-emitting display device according to the second embodiment of the present disclosure.

Referring to FIG. 4, a flexible organic light-emitting display device 200 according to a second embodiment of the present disclosure includes a light-emitting diode 270, an organic capping layer 280, an inorganic capping layer 285 and a front sealing layer 290.

The light-emitting diode 270 has a first electrode 272, an organic light-emitting layer 274 and a second electrode 276. The light-emitting diode 270 according to the second embodiment of the present disclosure is substantially the same as the light-emitting diode 170 according to the first embodiment, thereby omitting redundant description of the diode in the second embodiment.

The organic capping layer 280 is disposed on the second electrode 276 of the light-emitting diode 270. This organic capping layer 280 increases the light extraction effect and protects the light-emitting diode 270 from external moisture invasion and oxidation. The organic capping layer 280 prevents separation between the light-emitting diode 270 and the front sealing layer 280. To this end, the organic capping layer 280 has a considerably thin thickness, which in some embodiments may be less than 0.1 μm.

The material of the organic capping layer 280 may be, for example, the same material as one of the host materials of the light-emitting layers emitting the red, green, and blue light beams respectively. Alternatively, the material of the organic capping layer 280 may be the same as at least one material selected from the group consisting of materials of the hole transporting layer and the electron transporting layer. However, the present disclosure is not limited thereto. In one example, the organic capping layer 280 may include CBP (carbazole biphenyl) or mCP(1,3-bis(carbazol-9-yl). In this case, the organic capping layer 280 has a refractive index of 1.8 to 2.0. This refractive index may be referred to as a first refractive index as used herein.

An inorganic capping layer 285 is disposed on the organic capping layer 280. Specifically, the inorganic capping layer 285 is disposed between the organic capping layer 280 and the front sealing layer 290, and more specifically, between the organic capping layer 280 and the first inorganic sealing film 294 of the front sealing layer 290. A refractive index of the inorganic capping layer 285 is smaller than that of the organic capping layer 280. The difference between the refractive index of the inorganic capping layer 285 and the refractive index of the organic capping layer 280 is at least 0.3, and in some embodiments at least 0.4. Hereinafter, the refractive index of the inorganic capping layer 285 is referred to as a second refractive index. For this purpose, it is preferable for the inorganic capping layer 285 to include at least one of LiF, LiO, MgF2, NaF, CaO, KF, Bi2S3, Na5Al3F14 and SiO2.

In some embodiments, the organic capping layer 280 has a first refractive index of 1.8 to 2.0, while the inorganic capping layer 285 has a second refractive index of 1.3 to 1.5, which is at least 0.3 smaller than the first refractive index. For example, if the first refractive index is 1.8 (e.g., at the lowest refractive index within the range for the first refractive index) and the second refractive index is 1.5 (e.g., at the highest refractive index within the range for the second refractive index), then the difference between the first and second refractive indices is 0.3. The difference between the first and second refractive indices may be as great as 0.7 in some embodiments, for example, when the first refractive index is 2.0 and the second refractive index is 1.3.

As previously noted, in some embodiments, the difference between the first and second refractive indices is at least 0.4. In such embodiments, if the organic capping layer 280 has the first refractive index of 1.8, then the inorganic capping layer 285 has the second refractive index of 1.4 or less, so that the difference between the first and second refractive indices is at least 0.4. And, if the inorganic capping layer 285 has the second refractive index of 1.5, then the organic capping layer 280 has the first refractive index of at least 1.9, so that the difference between the first and second refractive indices is at least 0.4. On the other hand, if the first refractive index is 1.9 or more, then the second refractive index of the inorganic capping layer 285 may be anywhere within the range of 1.3 to 1.5, inclusive, and the difference between the first and second refractive indices will be at least 0.4.

The front sealing layer 290 is disposed on the inorganic capping layer 285. In this connection, the front sealing layer 290 may include a first inorganic sealing film 294 disposed on the inorganic capping layer 285, an organic sealing film 292 disposed on the first inorganic sealing film 294, and a second inorganic sealing film 296 disposed on the organic sealing film 292.

Each of the first and second inorganic sealing films 294 and 296 may be made of aluminum oxide (AlxOx), silicon oxide (SiOx), or silicon nitride (SiNx), silicon oxy-nitride (SiON), etc. Each of the first and second inorganic sealing films 294 and 296 has a third refractive index of 1.7 to 1.9 and a thickness of 1.5 μm or less.

According to the present disclosure, the organic sealing film 292 may be made of a UV-cured white ink material to achieve a low refractive index.

Such ultraviolet-cured white ink may include 30 to 45% by weight of pigment dispersion, 10 to 30% by weight of monofunctional monomer, 1 to 10% by weight of photo-initiator, and 5 to 15% by weight of oligomer.

The pigment dispersion may include white pigments, reactive monomers and dispersants. In this connection, titanium dioxide TiO2 and zinc oxide may be employed as the white pigments. The white pigments serve to increase the reflectance and thus allow concealing ability. The reactive monomer may employ a trifunctional acrylate-based monomer and a bifunctional acrylate-based monomer.

The trifunctional acrylate-based monomer may employ trimethylolpropane triacrylate (TMPTA), pentaerythritol triacrylate, trimethylene propane triacrylate, pentaerythritol triacrylate, trimethylene propyl triacrylate, propoxylated glycerol triacrylate, etc. alone or in combination thereof.

Further, the bifunctional acrylate-based monomer may employ 0,6-hexanediol diacrylate (HDDA), neopentylglycol diacrylate (NPGDA), dipropylene glycol diacrylate (DPGDA), tripropylene glycol diacrylate (TPGDA), etc. alone or in combination thereof.

When the addition amount of the pigment dispersion is less than 30% by weight, the hiding properties may be insufficient. On the other hand, when the addition amount of the pigment dispersion exceeds 45% by weight, dispersion may not be realized.

The monofunctional monomers serve to improve the adhesion while lowering the viscosity of the ink. Such a monofunctional monomer may employ a substance having a hydroxy functional group. Preferably, such a monofunctional monomer may employ at least one monomer selected from a group consisting of 2-hydroxyethyl acrylate (2-HEA), hydroxypropyl acrylate (HPA), 2-hydroxyethyl methacrylate (2-HEMA), hydroxypropyl methacrylate (HPMA), and 4-hydroxybutyl acrylate (4HBA). More preferably, such a monofunctional monomer may employ 2-hydroxyethyl acrylate (2-HEA).

When the addition amount of the monofunctional monomer is less than 10% by weight, there is a problem that the adhesion force is lowered. On the other hand, when the addition amount of the monofunctional monomer is more than 30% by weight, the addition amount of the white pigment is relatively decreased, and, thus, the light shielding property may not be sufficient.

The photo-initiator serves to initiate a curing reaction in which monomers having an unsaturated double bond as contained in the ink react to form a polymer in an ultraviolet curing process. Ethyl-2,4,6 trimethylbenzoylphenyl phosphinate oxides may be used as the photoinitiator. However, the present disclosure is not limited thereto.

When the addition amount of such a photoinitiator is less than 1% by weight, the curing reaction may be insufficient. On the other hand, when the addition amount of the photo-initiator exceeds 10% by weight, the photo-initiator may not be completely dissolved, which is not preferable.

Examples of the oligomer include acrylic oligomers including multifunctional acrylate (methacrylate), urethane acrylate, polyester acrylate, epoxy acrylate, and melamine acrylate, and polymers thereof.

When the addition amount of the oligomer is less than 5% by weight, it may be difficult to secure the strength. On the other hand, when the amount of the oligomer added is more than 15% by weight, the viscosity of the ink becomes too high, which may complicate the process.

Further, the ultraviolet cured white ink may further include at least one of a polyfunctional monomer, a polymerization inhibitor and a surfactant. In this connection, it is preferable that the total amount of at least one of the polyfunctional monomer, the polymerization inhibitor and the surfactant is not more than 10% by weight of the total weight of the ultraviolet cured white ink.

The polyfunctional monomer may employ a trifunctional acrylate-based monomer and a bifunctional acrylate-based monomer. The polymerization inhibitor serves to prevent the curing reaction from occurring during storage of the ink at room temperature.

The polymerization inhibitor may employ at least one of monomethyl ether hydroquinone (MEHQ), benzoquinone, catechol, phenothiazine, and N-nitrosophenylhydroxyamine, 2,2,6,6-tetramethylpiperidine-1-oxyl free radical, and derivatives thereof. The surfactant may employ a silicone surfactant or a fluorinated surfactant.

Thus, controlling each component and content thereof in the ultraviolet cured white ink may lead to control of the refractive index such that the organic sealing film 292 according to the second embodiment of the present disclosure may have a low refractive index.

Thus, the first and second inorganic sealing films 294 and 296 each has a third refractive index of 1.7 to 1.9, while the organic sealing film 292 has a fourth refractive index of 1.4 to 1.6 which is at least 0.1 smaller, and in some embodiments at least 0.3 smaller, than the third refractive index. The organic sealing film 292 has a thickness of 17 to 19 μm.

Accordingly, in the flexible organic light-emitting display device 200 according to the second embodiment of the present disclosure, the organic sealing film 292 having a fourth refractive index at least 0.1, and in some embodiments at least 0.3 smaller than the third refractive index is disposed between first and second inorganic sealing films 294 and 296. Thus, even in the front sealing layer 290, the refractive index difference may be increased to maximize the micro-cavity effect, thereby improving the light extraction efficiency.

In other words, the flexible organic light-emitting display device according to the second embodiment of the present disclosure may have a stack of the following components sequentially: the organic capping layer 280 having the first refractive index of 1.8 to 2.0; the inorganic capping layer 285 having the second refractive index of 1.3 to 1.5 which may be at least 0.4 smaller than the first refractive index; the first inorganic sealing film 294 with the third refractive index of 1.7 to 1.9; the organic sealing film 292 having the fourth refractive index of 1.4 to 1.6 which may be at least 0.3 smaller than the third refractive index; and the second inorganic sealing film 296 with a third refractive index of 1.7 to 1.9.

Thus, in the flexible organic light-emitting display device 200 according to the second embodiment of the present disclosure, the inorganic capping layer 285 having a lower refractive index of 1.3 to 1.5 is disposed between the organic capping layer 280 having a higher refractive index and the first inorganic sealing film 294 of the front sealing layer 290 having a higher refractive index. Thus, the refractive index difference between the organic capping layer 280 and the inorganic capping layer 285 is increased, such that the light extraction efficiency can be improved via the increase of the micro-cavity effect.

Further, in the flexible organic light-emitting display device 200 according to the second embodiment of the present disclosure, the organic sealing film 292 having the fourth refractive index which may be at least 0.3 smaller than the third refractive index is disposed between the first and second inorganic sealing films 294 and 296. This also increases the refractive index difference in the front sealing layer 290, thereby increasing the micro-cavity effect and thus improving the light extraction efficiency.

Moreover, in a flexible organic light-emitting display device according to a third embodiment of the present disclosure, the inorganic capping layer having a refractive index at least 0.4 smaller than the refractive index of the organic capping layer is disposed between the organic capping layer and the front sealing layer, and, at the same time, the thickness of the front sealing layer is optimized such that the light extraction efficiency may be further increased in the third embodiment compared to the second embodiment.

This will be described in more detail with reference to the accompanying drawings.

Figure 5:
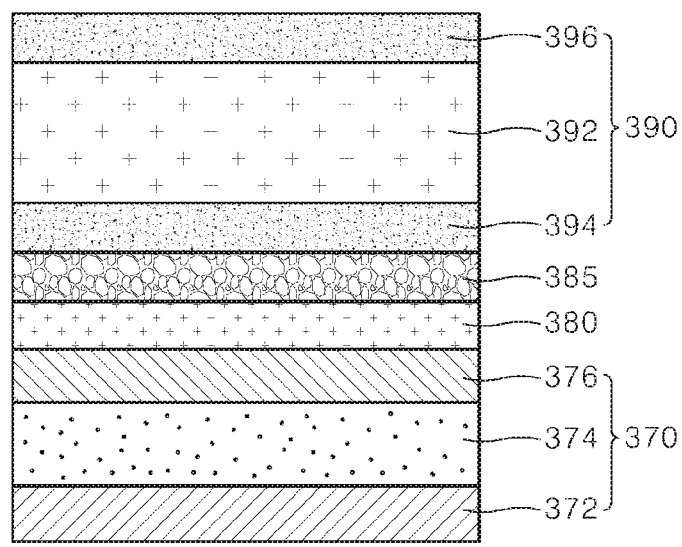
FIG. 5 is a schematic diagram of an OLED display according to a third embodiment of the present disclosure.

FIG. 5 is a schematic representation of a flexible organic light-emitting display device according to a third embodiment of the present disclosure.

Referring to FIG. 5, the flexible organic light-emitting display device 300 according to the third embodiment of the present disclosure may have the same configuration as that of the flexible organic light-emitting display device according to the second embodiment of the present disclosure except that a front sealing layer 390 in the third embodiment has an optimal thickness to increase light extraction efficiency. Thus, duplicate descriptions therebetween should be omitted and differences therebetween will be explained below.

The front sealing layer 390 in the third embodiment of the present disclosure may include a first inorganic sealing film 394 disposed on the inorganic capping layer 385, an organic sealing film 392 disposed on the first inorganic sealing film 394, and a second inorganic sealing film 396 disposed on the organic sealing film 392.

Each of the first and second inorganic sealing films 394 and 396 may be made of aluminum oxide (AlxOx), silicon oxide (SiOx), or silicon nitride (SiNx), silicon oxy-nitride (SiON), etc. Each of the first and second inorganic sealing films 394 and 396 has a third refractive index of 1.7 to 1.9. In this connection, in one embodiment, each of the first and second inorganic sealing films 394 and 396 may have a thickness of 0.5 to 1 μm and the organic sealing film 392 may have a thickness of 3 to 9 μm.

If the thickness of the organic sealing film 392 is less than 3 it may be difficult to exhibit the sealing effect properly. Conversely, when the thickness of the organic sealing film 392 exceeds 9 μm, a total thickness of the front sealing layer 390 is larger than 10 μm, which makes it difficult to maximize the light extraction efficiency.

Thus, as in the second embodiment, in the flexible organic light-emitting display device 300 according to the third embodiment of the present disclosure, the inorganic capping layer 385 having a lower refractive index of 1.3 to 1.5 is disposed between the organic capping layer 380 having a higher refractive index and the first inorganic sealing film 394 of the front sealing layer 390 having a higher refractive index. Thus, the refractive index difference between the organic capping layer 380 and the inorganic capping layer 385 may be maximized, and, thus, the light extraction efficiency may be improved by increasing the micro-cavity effect.

Further, as in the second embodiment, in the flexible organic light-emitting display device 300 according to the third embodiment of the present disclosure, the organic sealing film 392 having a fourth refractive index of at least 0.3 smaller than the third refractive index is disposed between the first and second inorganic sealing films 394 and 396. At the same time, in the third embodiment, the thickness of the front sealing layer 390 is optimized to be less than 10 μm. Thus, increasing the refractive index difference in the front sealing layer 390, and, at the same time, optimizing the thickness thereof may result in increasing the cavity effect. Thus, the light extraction efficiency can be further increased in the third embodiment compared to the second embodiment.

Figure 6:
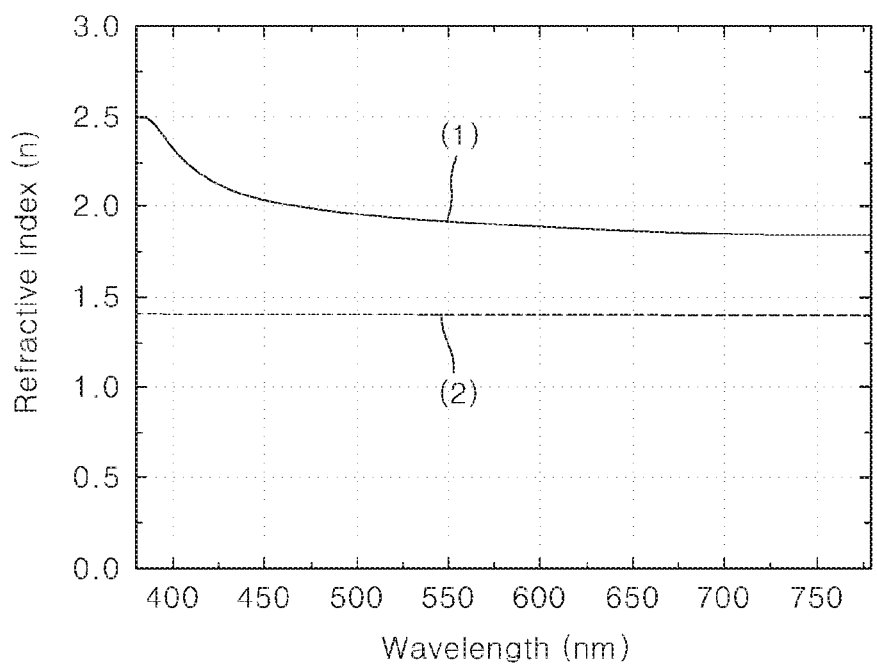
FIG. 6 is a graph showing refractive index measurements of an organic capping layer and inorganic capping layer according to the third embodiment of the present disclosure.
Figure 7:
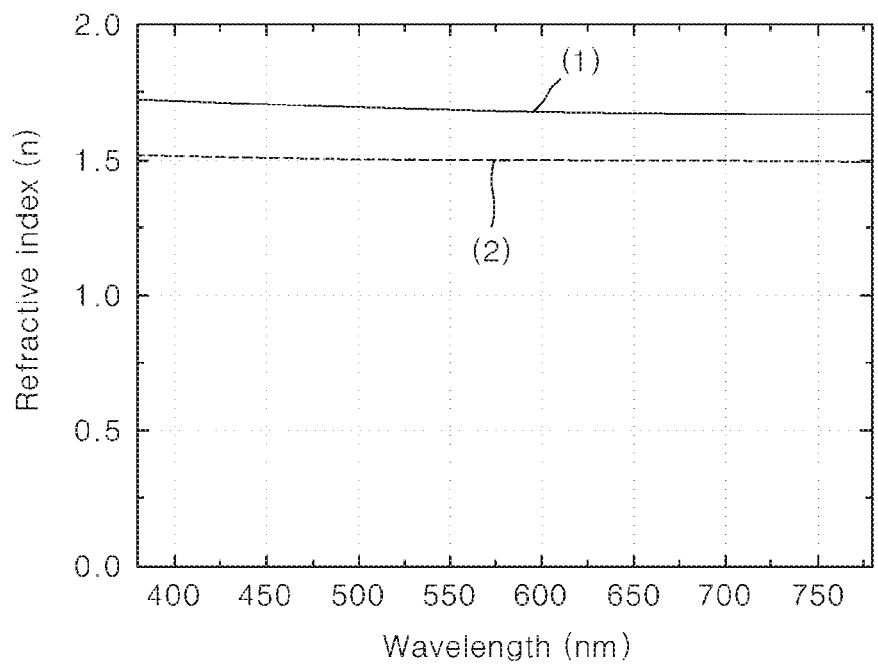
FIG. 7 is a graph showing refractive index measurements of an organic sealing film according to the second and third embodiments of the present disclosure.

FIG. 6 is a graph showing refractive index measurements of an organic capping layer and inorganic capping layer according to the third embodiment of the present disclosure. FIG. 7 is a graph showing results of refractive index measurements of an organic sealing film according to the second and third embodiments of the present disclosure.

In this connection, in FIG. 6, reference numeral (1) denotes a wavelength-based refractive index value for the organic capping layer, while reference numeral (2) denotes a wavelength-based refractive index value for the inorganic capping layer.

As shown in FIG. 6, it may be confirmed from the results of refractive index measurements at 550 nm wavelength for the organic capping layer and inorganic capping layer according to the third embodiment of the present disclosure, that the organic capping layer exhibits a refractive index of 1.9 (1), while the inorganic capping layer exhibits a refractive index of 1.4 (2).

In this connection, in FIG. 7, reference numeral (1) denotes a wavelength-based refractive index value for the organic capping layer in the second embodiment, while reference numeral (2) denotes a wavelength-based refractive index value for the organic capping layer in the third embodiment.

Further, it may be confirmed from the results of refractive index measurements at 550 nm wavelength for the organic capping layers according to the second and third embodiments of the present disclosure, that the organic capping layer in the second embodiment exhibits a refractive index of 1.7 (1), while the organic capping layer in the third embodiment exhibits a refractive index of 1.4 (2).

Figure 8:
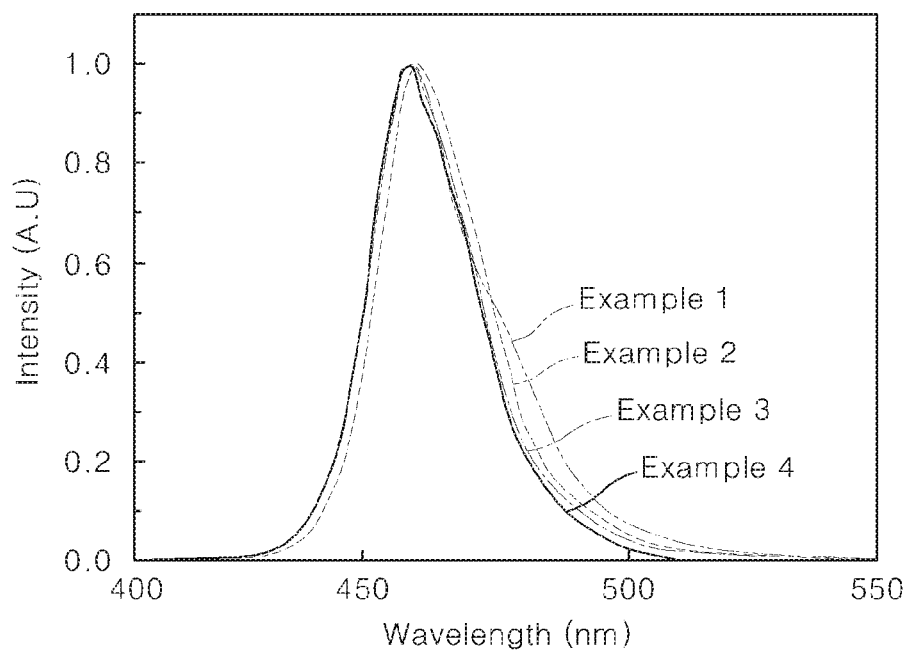
FIG. 8 is a graph showing EL (electro-luminescence) spectrum measurement results for examples 1 to 4.
Figure 9:
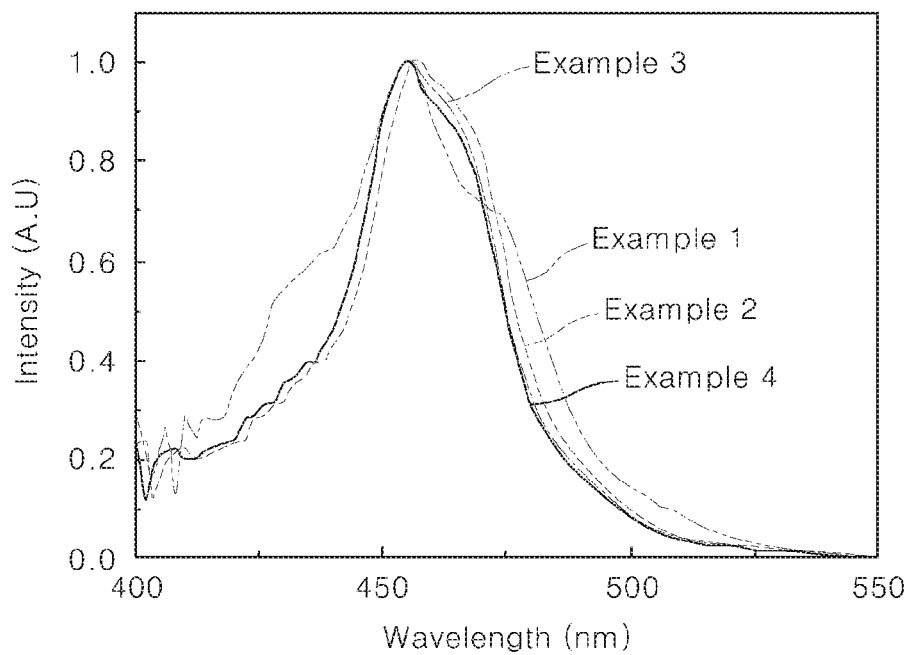
FIG. 9 is a graph showing OC (out-coupling) spectral measurement results for examples 1 to 4.

Furthermore, flexible organic light-emitting display devices according to examples 1 to 4 were fabricated under conditions listed in Table 1 below. Table 2 below shows the physical property evaluation results for the flexible organic light-emitting display devices manufactured according to examples 1 to 4 above. Further, FIG. 8 is a graph showing the results of EL spectrum measurement for examples 1 to 4. FIG. 9 is a graph showing the OC spectral measurement results for examples 1 to 4.

In this connection, each of the flexible organic light-emitting display devices according to examples 1 to 4 was fabricated as follows: an organic light emitting diode (OLED) is formed on a substrate; then, an organic capping layer and an inorganic capping layer are sequentially formed on the diode; thereafter, a front sealing layer having a first inorganic sealing film, an organic sealing film and a second inorganic sealing film is formed on the inorganic capping layer; thereafter, an adhesive and a barrier film are sequentially stacked on the second inorganic sealing film. In this case, in the examples 1 to 4, CBP (carbazole biphenyl) was used as the organic capping layer, and polyimide resin was used as the organic sealing film.

TABLE 1

| Example | Organic capping layer (CPL) | Inorganic capping layer | First inorganic sealing film (SiNx) | Organic sealing film (PCL) | Second inorganic sealing film (SiNx) |
| --- | --- | --- | --- | --- | --- |
| 1 | n = 1.9, d = 400 Å | — | n = 1.8, d = 1.5 μm | n = 1.7, d = 18 μm | n = 1.8, d = 1.5 um |
| 2 | n = 1.9, d = 1000 Å | n = 1.4, d = 400 Å | n = 1.8, d = 1.5 μm | n = 1.7, d = 18 μm | n = 1.8, d = 1.5 um |

TABLE 1-continued

| Example | Organic capping layer (CPL) | Inorganic capping layer | First inorganic sealing film (SiNx) | Organic sealing film (PCL) | Second inorganic sealing film (SiNx) |
| --- | --- | --- | --- | --- | --- |
| 3 | n = 1.9, d = 1000 Å | n = 1.4, d = 400 Å | n = 1.8, d = 1.5 μm | n = 1.7, d = 8 μm | n = 1.8, d = 1.5 um |
| 4 | n = 1.9, d = 1000 Å | n = 1.4, d = 400 Å | n = 1.8, d = 1.5 μm | n = 1.7, d = 5 μm | n = 1.8, d = 1.5 um |

TABLE 2

| Example | Blue @ 10 mA/cm$^2$ | | | | | FWHM (nm) | |
| --- | --- | --- | --- | --- | --- | --- | --- |
| | V | cd/A | CIEy | CIEx | CIEy | EL | OC |
| 1 | 4.5 | 5.6 | 109.1 | 0.140 | 0.055 | 27 | 54 |
| 2 | 4.5 | 5.7 | 116.3 | 0.140 | 0.049 | 24 | 34 |
| 3 | 4.5 | 5.8 | 116.7 | 0.141 | 0.048 | 24 | 34 |
| 4 | 4.5 | 6.0 | 116.9 | 0.141 | 0.048 | 23 | 33 |

As shown in Table 1 and Table 2, it may be seen that, for the examples 2 to 4, the light extraction value from the blue light-emitting layer is 5.7 to 6.0 cd/A, which is improved compared to the example 1 in which the inorganic capping layer is not applied.

That is, as shown in Equation 1 below, the light extraction efficiency and color purity are improved due to the constructive interference effect due to the optical interference in the light-emitting diode:

$$I_{out}(\lambda) = G_{cav}(\lambda) I_{EML}(\lambda) \qquad \text{Equation (1),}$$

where, Iout indicates EL for a light-emitting dopant, Gcav indicates OC (out-coupling) due to the cavity effect, IEML indicates PL for a light-emitting dopant.

In this connection, it may be confirmed that, as for the examples 2 to 4, the light extraction efficiency is increased despite the fact that the OC is decreased and, thus, the EL value is lowered due to the cavity effect, in comparison with example 1.

Specifically, FIG. 8 and FIG. 9 show the measurement results of the EL spectrum and the OC spectrum showing the wavelength-based intensity peaks for the example 1 to 4, respectively. In this connection, FIG. 8 and FIG. 9 show wavelength changes in normalized EL and OC with intensity measurements being fixed to 1 in the EL and OC spectra, respectively.

As shown in FIG. 8, it may be seen that a full width at half maximum (FWHM) of the EL is narrower in each of the examples 2 to 4 than in the example 1. In this connection, the full width at half maximum means a width of the wavelength in the EL distribution at a ½ intensity of the maximum intensity. Further, as shown in FIG. 9, it may be seen that as for the examples 2 to 4, the full width at half maximum (FWHM) of the out coupling (OC) due to the cavity structure becomes narrower than in the example 1.

In this connection, it may be confirmed although the full width at half maximum (FWHM) of the EL and the full width at half maximum (FWHM) of the outcoupling (OC) for the examples 2 to 4 are narrower than in the example 1, the light extraction efficiency is increased in the examples 2 to 4 compared to the example 1. This is because the OC distribution curve and the PL distribution curve are substantially similar with each other for each of the examples 2 to 4, and, thus, the difference between the full width at half maximum of the OC distribution and the full width at half maximum of the PL distribution is reduced to improve the light extraction.

Figure 10:
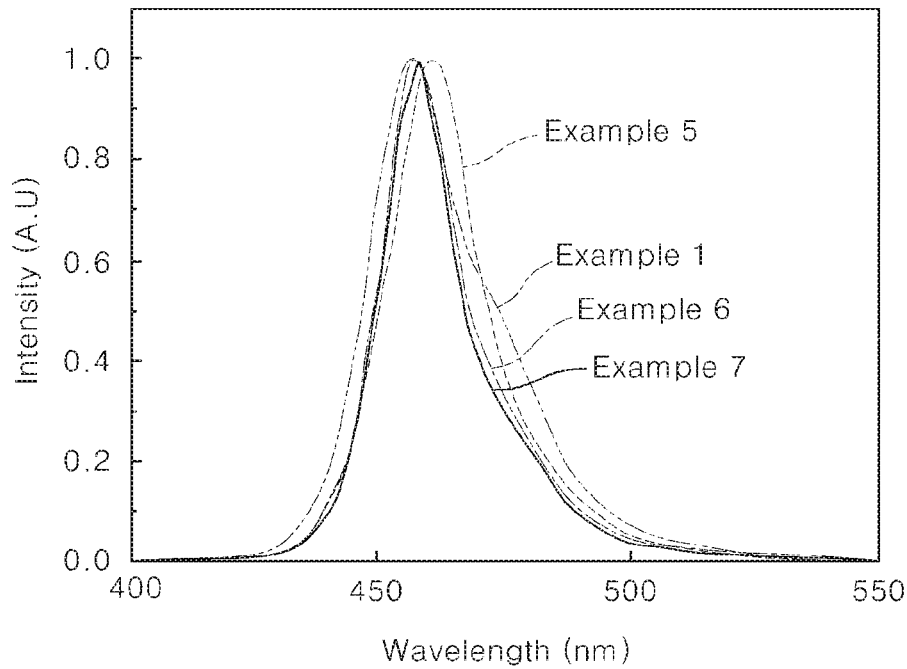
FIG. 10 is a graph showing results of EL spectrum measurement for example 1 and examples 5 to 7.
Figure 11:
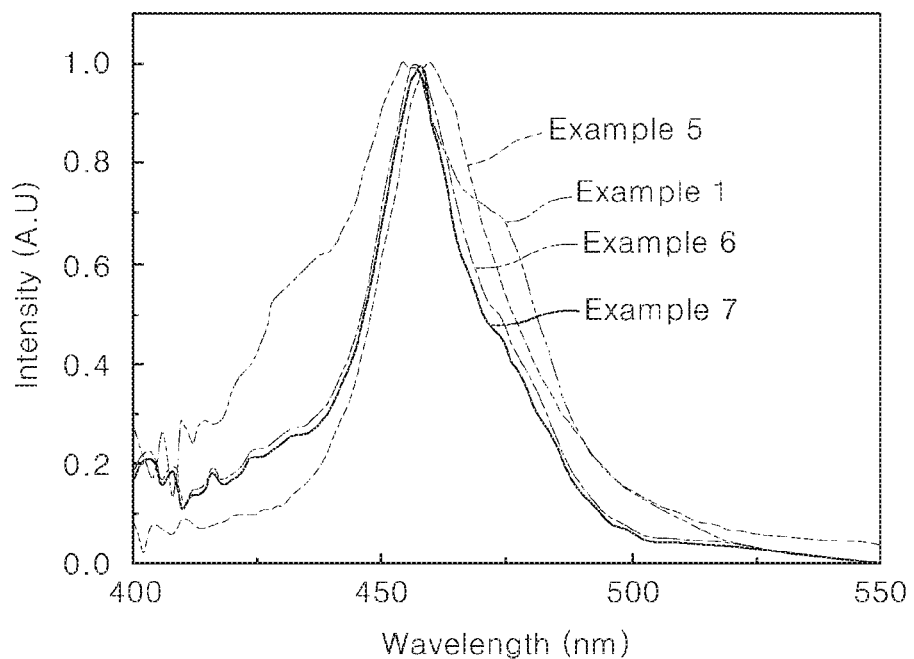
FIG. 11 is a graph showing results of OC spectrum measurement for example 1 and examples 5 to 7.

Furthermore, flexible organic light-emitting display devices according to examples 1, and 5 to 7 were fabricated under conditions listed in Table 3 below. Table 4 below shows the physical property evaluation results for the flexible organic light-emitting display devices manufactured according to examples 1, and 5 to 7 above. Further, FIG. 10 is a graph showing the results of EL spectrum measurement for examples 1, 5 to 7. FIG. 11 is a graph showing the OC spectral measurement results for examples 1, 5 to 7.

In this connection, each of the flexible organic light-emitting display devices according to examples 5 to 7 was fabricated as follows: an organic light emitting diode (OLED) is formed on a substrate; then, an organic capping layer and an inorganic capping layer are sequentially formed on the diode; thereafter, a front sealing layer having a first inorganic sealing film, an organic sealing film and a second inorganic sealing film is formed on the inorganic capping layer; thereafter, an adhesive and a barrier film are sequentially stacked on the second inorganic sealing film.

In this case, in the examples 5 to 7, the organic capping layer employed CBP (carbazole biphenyl), the organic sealing film was prepared as follows: a UV curable white ink composition was provided which contains 40% by weight of a pigment dispersion, 25% by weight of a monofunctional monomer 2-HEA (2-hydroxyethyl acrylate), 5% by weight of a photo-initiator TPO (Lucirin®TPO), 10% by weight of an oligomer DPHA (dipentaerythritol hexaacrylate); then, the UV curable white ink is applied and UV-cured. The pigment dispersion contains a white pigment $TiO_2$, a reactive monomer HDDA (1,6-hexanediol diacrylate), and a dispersant Hybridur®870 (available from Air Products company).

TABLE 3

| Example | Organic capping layer (CPL) | Inorganic capping layer | First inorganic sealing film (SiNx) | Organic sealing film (PCL) | Second inorganic sealing film (SiNx) |
| --- | --- | --- | --- | --- | --- |
| Example 1 | n = 1.9, d = 400 Å | — | n = 1.8, d = 1.5 μm | n = 1.7, d = 18 μm | n = 1.8, d = 1.5 um |
| Example 5 | n = 1.9, d = 1000 Å | n = 1.4, d = 400 Å | n = 1.5, d = 18 μm | n = 1.5, d = 18 μm | n = 1.8, d = 1.5 um |
| Example 6 | n = 1.9, d = 1000 Å | n = 1.4, d = 400 Å | n = 1.8, d = 1.5 μm | n = 1.5, d = 8 μm | n = 1.8, d = 1.5 um |
| Example 7 | n = 1.9, d = 1000 Å | n = 1.4, d = 400 Å | n = 1.8, d = 1.5 μm | n = 1.5, d = 5 μm | n = 1.8, d = 1.5 um |

TABLE 4

| Example | Blue @ 10 mA/cm² | | | | FWHM | |
| --- | --- | --- | --- | --- | --- | --- |
| | V | cd/A | CIEy | CIEx | CIEy (nm) | |
| | | | | | EL | OC |
| Example 1 | 4.5 | 5.6 | 109.1 | 0.140 | 0.055 | 27 | 54 |
| Example 5 | 4.5 | 6.1 | 119.6 | 0.139 | 0.051 | 23 | 30 |
| Example 6 | 4.5 | 6.2 | 126.5 | 0.141 | 0.049 | 20 | 27 |
| Example 7 | 4.5 | 6.2 | 129.2 | 0.141 | 0.048 | 19 | 25 |

In the examples 5 to 7, the thickness of the front sealing layer was optimized to increase the light extraction. As shown in Table 3 and Table 4, it may be seen that, for the examples 5 to 7, the light extraction value from the blue light-emitting layer is 6.1 to 6.2 cd/A, which is improved compared to the example 1 in which the inorganic capping layer is not applied. Further, due to the thickness optimization, the light extraction value is further increased in the examples 5 to 7 compared to the examples 2 to 4.

Specifically, FIG. 10 and FIG. 11 show the measurement results of the EL spectrum and the OC spectrum showing the wavelength-based intensity peaks for the example 1 to examples 5 to 7, respectively. In this connection, FIG. 10 and FIG. 11 show wavelength changes in normalized EL and OC with intensity measurements being fixed to 1 in the EL and OC spectra, respectively.

As shown in FIG. 10, it may be seen that a full width at half maximum (FWHM) of the EL is narrower in each of the examples 5 to 7 than in the example 1. In this connection, the full width at half maximum means a width of the wavelength in the EL distribution at a ½ intensity of the maximum intensity. Further, as shown in FIG. 11, it may be seen that as for the examples 5 to 7, the full width at half maximum (FWHM) of the out coupling (OC) due to the cavity structure becomes narrower than in the example 1.

In this connection, it may be confirmed although the full width at half maximum (FWHM) of the EL and the full width at half maximum (FWHM) of the outcoupling (OC) for the examples 5 to 7 are narrower than in the example 1, the light extraction efficiency is increased in the examples 5 to 7 compared to the example 1. This is because the OC distribution curve and the PL distribution curve are substantially similar with each other for each of the examples 5 to 7, and, thus, the difference between the full width at half maximum of the OC distribution and the full width at half maximum of the PL distribution is reduced to improve the light extraction.

Figure 12:
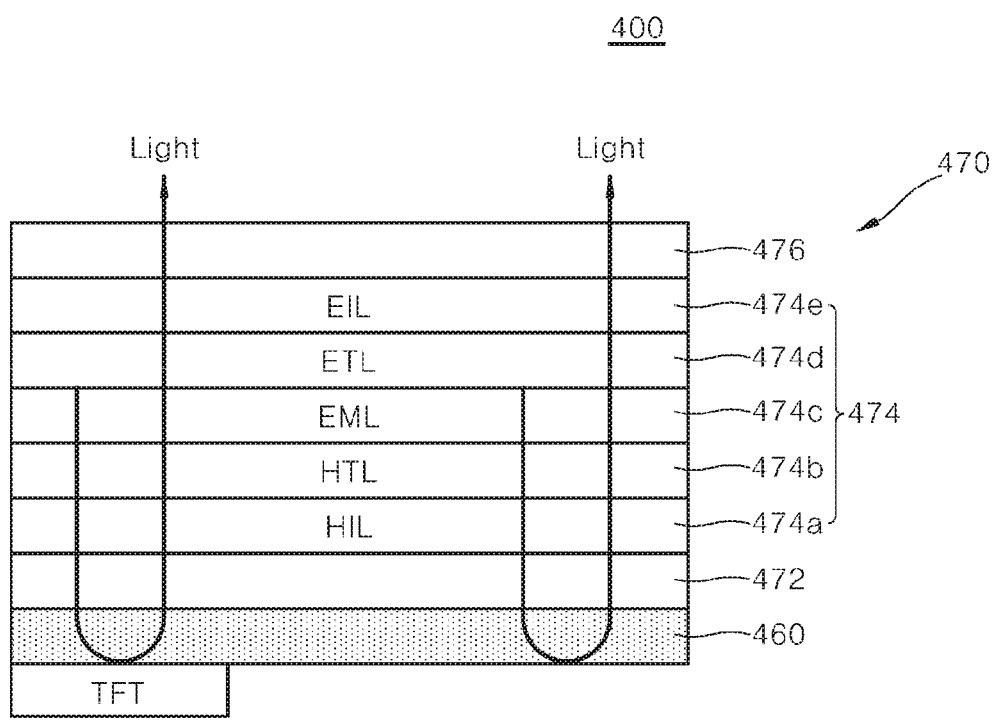
FIG. 12 is a schematic representation of a flexible organic light-emitting display device according to a fourth embodiment of the present disclosure.
Figure 13:
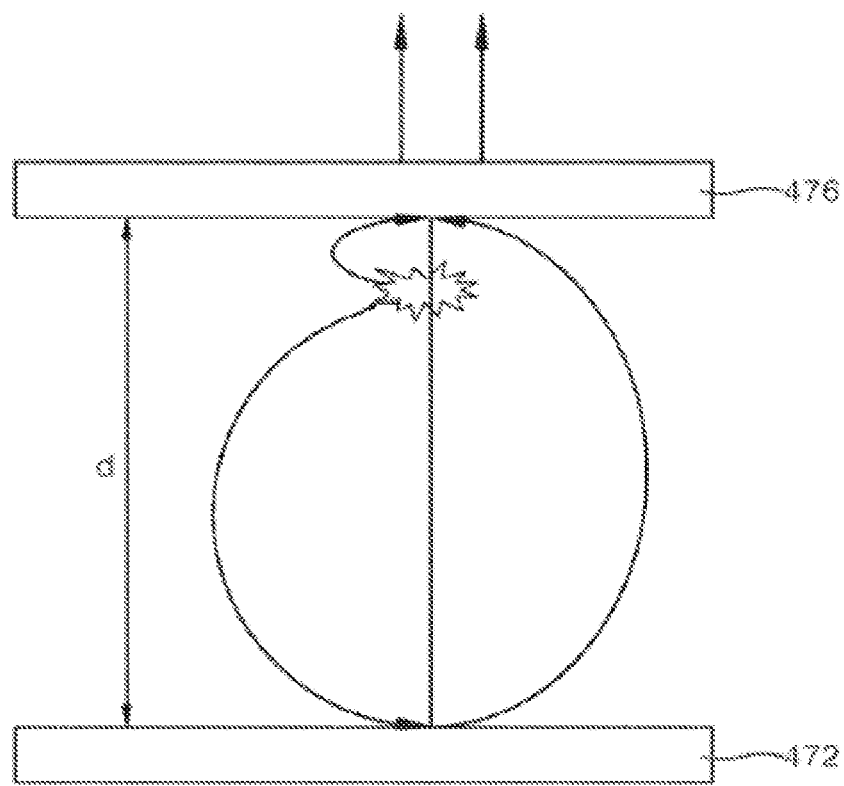
FIG. 13 is a schematic diagram illustrating a light path of a flexible organic light-emitting display device according to the fourth embodiment of the present disclosure.

FIG. 12 is a schematic representation of a flexible organic light-emitting display device according to a fourth embodiment of the present disclosure. FIG. 13 is a schematic diagram illustrating a light path of a flexible organic light-emitting display device according to the fourth embodiment of the present disclosure.

Referring to FIG. 12 and FIG. 13, an OLED display 400 according to a fourth embodiment of the present disclosure includes a light-emitting diode 470 having a first electrode 472, an organic light-emitting stack 474 and a second electrode 476.

The first electrode 472 may be electrically connected to the driving transistor (DT in FIG. 2) as disposed on the substrate. The first electrode 472 is formed of a light-transmissive single layer structure including a transparent conductive material such as indium tin oxide (ITO) or indium zinc oxide (IZO).

Accordingly, the flexible display device 400 according to the fourth embodiment of the present disclosure may further include a reflective electrode 460 disposed under the first electrode 472. The reflective electrode 460 is disposed on a backside of the first electrode 472 and serves to reflect the light emitted from the light-emitting layer 474c of the light-emitting diode 470 back toward the second electrode 476. To this end, a silver (Ag) or a silver alloy (AgNd) material may be used as the reflective electrode 460.

The organic light-emitting stack 474 is disposed on the first electrode 472. The organic light-emitting stack 474 may include an organic light-emitting layer 474c. For example, the organic light-emitting layer 474c may include a white light emitting layer, a blue organic light-emitting layer, a red organic light-emitting layer, and a green organic light-emitting layer. Alternatively, the organic light-emitting layer 474c may have a tandem structure including a blue light-emitting layer and a yellow-green light-emitting layer. However, the organic light-emitting layer 474c in accordance with the present disclosure is not limited to the above structure but may include various structures.

Further, as shown in FIG. 12, the organic light-emitting stack 474 of the light-emitting diode 470 may further include an electron injection layer 474e (EIL) and a hole injection layer 474a (HIL) for injecting electrons and holes into an electron transport layer and a hole transport layer respectively; an electron transport layer (474d) (ETL) and a hole transport layer (474b) (HTL) for transporting the injected electrons and holes thereto to the organic light-emitting layer 474c; and the light emitting layer 474c (EML) disposed between the electron transporting layer and the hole transporting layer for emitting light.

For this purpose, the light-emitting layer 474c is preferably made of a material having good quantum efficiency for fluorescence or phosphorescence. Specifically, the light-emitting layer 474c is made of a host and a luminescent dopant, and may include a material emitting red, green, blue or white light.

In this connection, when the light-emitting layer 474c emits red light, the layer may include host material including CBP(carbazole biphenyl) or mCP(1,3-bis(carbazol-9-yl). The layer further includes a phosphor containing at least one light emission dopant selected from PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum), or fluorescent material including PBD:Eu(DBM)3(Phen) and Perylene. However, the present disclosure is not limited thereto.

Further, when the light-emitting layer 474c emits green light, the layer may include host material including CBP or mCP. The layer further includes a phosphor containing a light emission dopant including Ir(ppy)3(fac tris(2-phenylpyridine)iridium) or fluorescent material including Alq3 (tris(8-hydroxyquinolino)aluminum). However, the present disclosure is limited thereto.

Further, when the light-emitting layer 474c emits blue light, the layer may include host material including CBP, or mCP. In this embodiment, the layer 474c further includes a boron-based light emission dopant added into the host material. This will be described in details below.

The second electrode 476 is disposed on the organic light-emitting stack 474. The second electrode 476 may be embodied as a single layer or a multi-layer structure. In the latter case, each layer of the second electrode 476 may be embodied as a metal layer, an inorganic layer, a mixture layer of metals, or a mixture layer of a metal and an inorganic material, or a combination thereof.

In this connection, in one example, the first electrode 472 may be the anode of the light-emitting diode 470 while the second electrode 476 may be the cathode of the diode. When a voltage is applied to the first electrode 472 and the second electrode 476, electrons are injected into the organic light-emitting stack 474 from the second electrode 476, while holes are injected into the organic light-emitting stack 474 from the first electrode 472. Thus, an exciton is generated in the organic light-emitting layer 474c. As the exciton decays, light corresponding to the energy difference between the LUMO (Lowest Unoccupied Molecular Orbital) of the organic light-emitting layer 474c and the HOMO (Highest Occupied Molecular Orbital) of the layer 474c may be generated. Then, the light is emitted upwardly from the second electrode 476.

Figure 14:
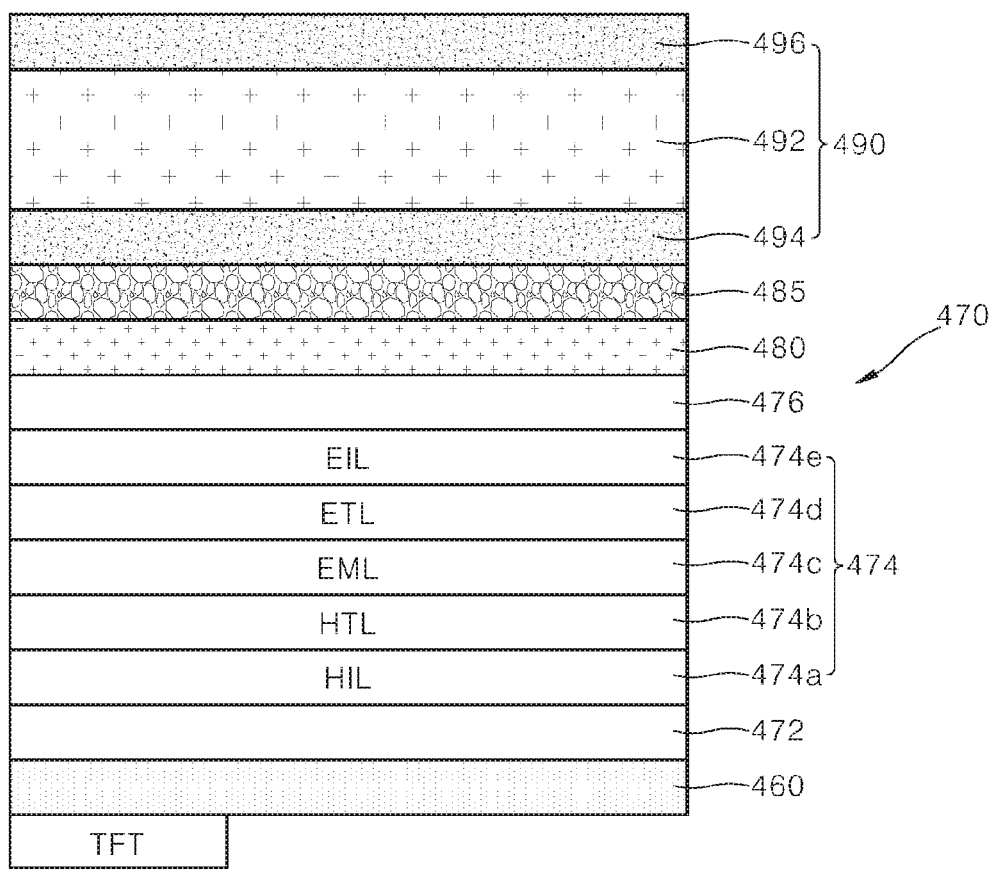
FIG. 14 is a more specific illustration of a flexible organic light-emitting display device according to the fourth embodiment of the present disclosure.

In this connection, FIG. 14 is a more specific schematic diagram of an OLED display device according to the fourth embodiment of the present disclosure.

As shown in FIG. 14, the OLED display device 400 according to the fourth embodiment of the present disclosure includes an organic capping layer 480 disposed on the second electrode 476 of the light-emitting diode 470; a front sealing layer 490 disposed on the organic capping layer 480, wherein the front sealing layer 490 has a first inorganic sealing film 494, an organic sealing film 492 disposed on the first inorganic sealing film 494, and a second inorganic sealing film 496 disposed on the organic sealing film 492; and an inorganic capping layer 485 disposed between the organic capping layer 480 and the front sealing layer 490.

The organic capping layer 480, the front sealing layer 490 and the inorganic capping layer 485 according to the fourth embodiment of the present disclosure may have respectively the same configuration as those of the organic capping layer, the front sealing layer and the inorganic capping layer according to the second or third embodiment of the present disclosure. Therefore, the redundant descriptions between them will be omitted.

As shown in Equation 1 below, the light extraction efficiency and color purity are improved due to the constructive interference effect due to the optical interference in the light-emitting diode:

$$I_{out}(\lambda) = G_{cav}(\lambda) I_{EML}(\lambda)$$ Equation (1), where, Iout indicates EL for a light-emitting dopant, Gcav indicates OC (out-coupling) due to the cavity effect, IEML indicates PL for a light-emitting dopant.

Thus, in order that the light extraction efficiency and color purity are improved due to the constructive interference effect based on the above equation, the optimal thickness of the light-emitting layer 474c varies based on R, G, and B colors and depending on the optical distance between the first electrode 472 and the second electrode 476.

Further, conventionally, the luminescent dopant in the blue light-emitting layer 474c employs a pyrene-based material. In this case, the FWHM of the PL distribution of the luminescent dopant is relatively broader than the FWHM of the OC (out coupling) distribution. Thus, the light extraction efficiency is lowered.

To solve this problem, the flexible organic light-emitting display device 400 according to the fourth embodiment of the present disclosure includes a blue light-emitting layer 474c the host material doped with a boron-based luminescent dopant.

Thus, in the flexible organic light-emitting display device 400 according to a fourth embodiment of the present disclosure, a difference between the full width at half maximum (FWHM) of the PL distribution of the luminescent dopant and the full width at half maximum (FWHM) of the out coupling (OC) distribution due to the cavity structure may be reduced to 5 nm or less. As a result, the light extraction efficiency is maximized.

Figure 15:
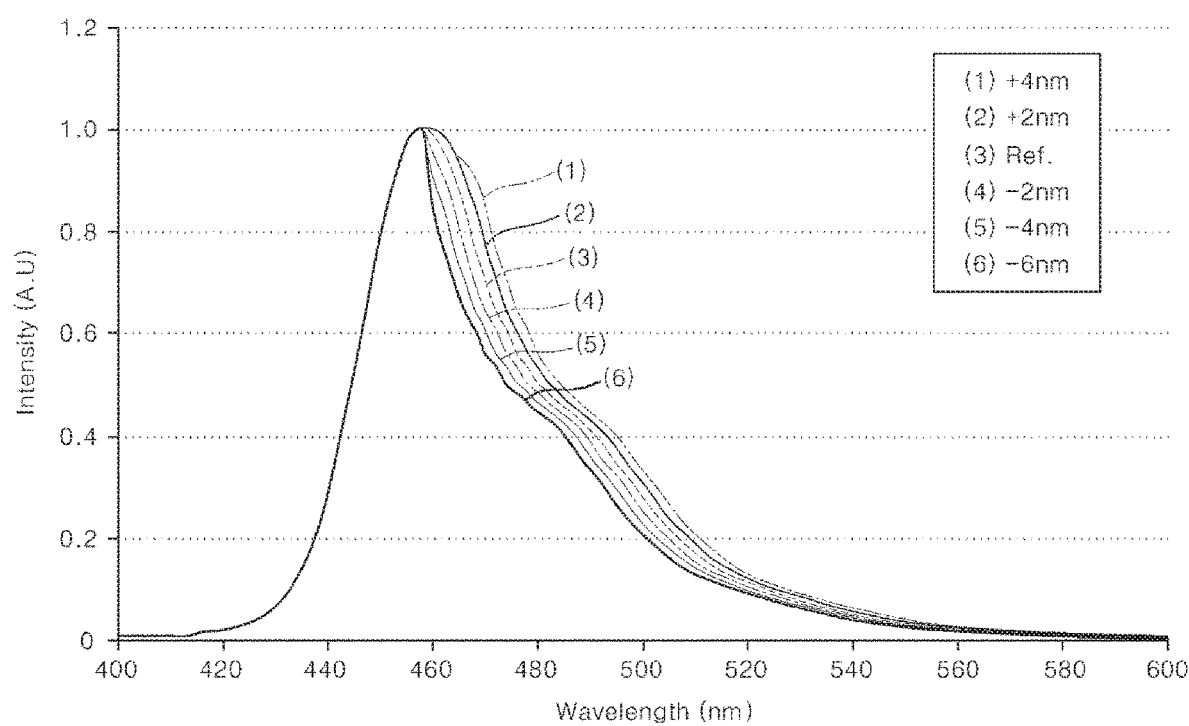
FIG. 15 is a graph showing luminance measurement results based on a full width at half maximum (FWHM) of blue PL (photo-luminescence) for a flexible organic light-emitting display device according to the fourth embodiment of the present disclosure.
Figure 16:
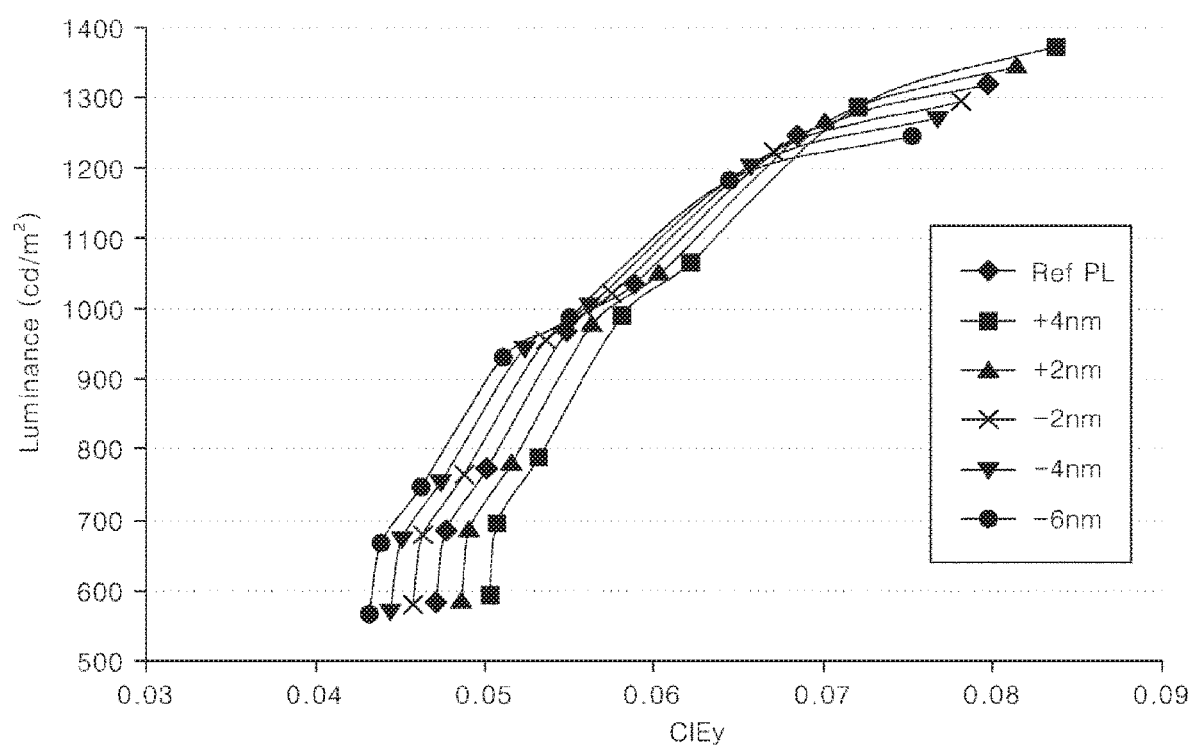
FIG. 16 is a graph showing results of CIEy-luminance measurement for a flexible organic light-emitting display device according to the fourth embodiment of the present disclosure.

FIG. 15 is a graph showing luminance measurement results based on a full width at half maximum (FWHM) of blue PL (photo-luminescence) for a flexible organic light-emitting display device according to the fourth embodiment of the present disclosure. FIG. 16 is a graph showing results of CIEy-luminance measurement for a flexible organic light-emitting display device according to the fourth embodiment of the present disclosure.

As shown in FIG. 15 and FIG. 16, for a flexible organic light-emitting display device according to the fourth embodiment, when the full width at half maximum (FWHM) of the PL distribution decreases, the luminance may rise in a reference color coordinate.

FIG. 17 is a graph showing a chemical structure and corresponding PL spectrum measurement for a dopant used in a flexible organic light-emitting display device and according to a comparison example. FIG. 18 is a graph showing a chemical structure and corresponding PL spectrum measurement results for a dopant used in the flexible organic light-emitting display device according to the fourth embodiment.

Figure 17A:
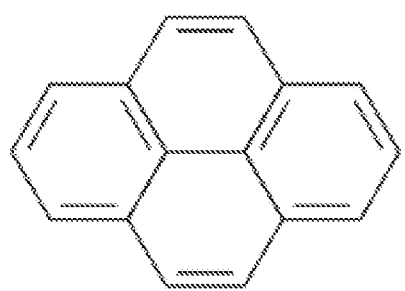
FIG. 17A illustrates a chemical structure of a dopant used in a flexible organic light-emitting display device and according to a comparison example.
Figure 17B:
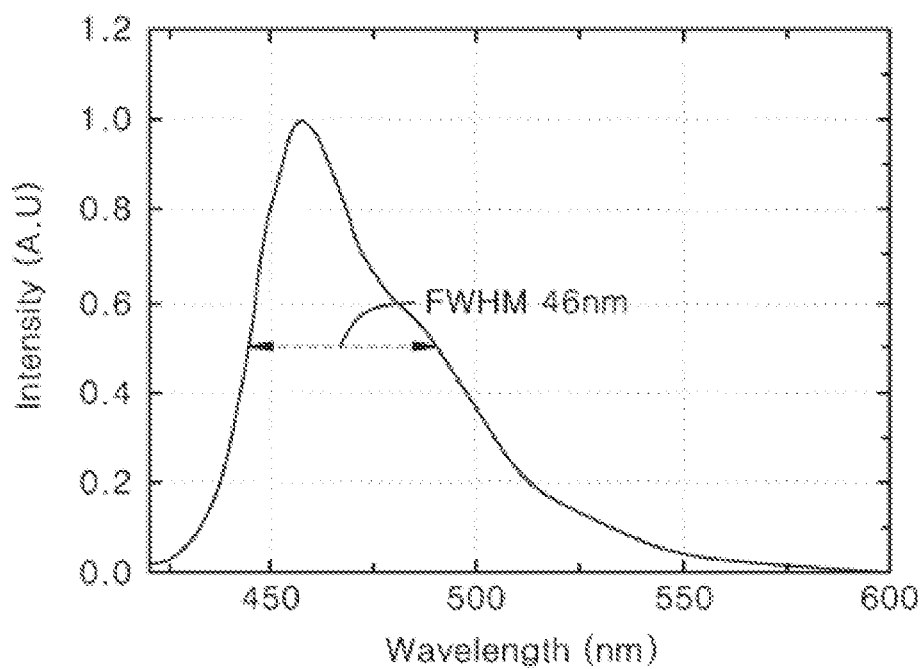
FIG. 17B is a graph showing the corresponding PL spectrum measurement for comparison example using the dopant of FIG. 17A.

As shown in FIGS. 17A and 17B, the chemical structure of the pyrene-based dopants applied to the comparison example is shown. In the comparison example, it may be seen that the full width at half maximum (FWHM) of the PL distribution is 46 nm.

Figure 18A:
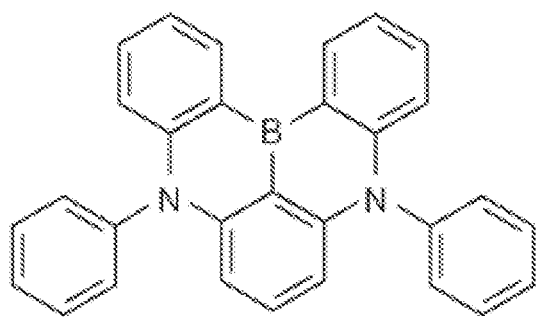
FIG. 18A illustrates a chemical structure of a dopant used in the flexible organic light-emitting display device according to the fourth embodiment.
Figure 18B:
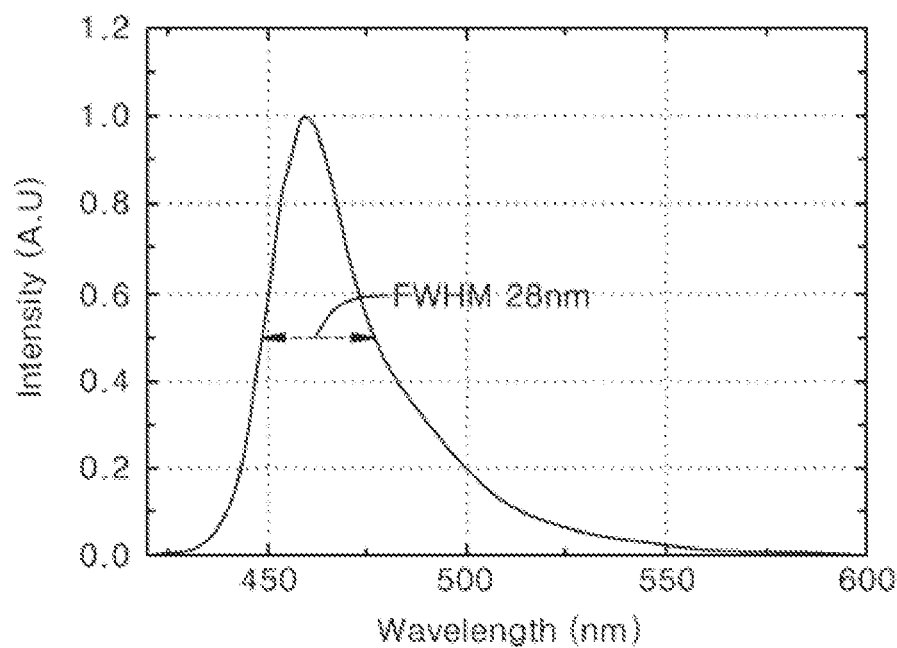
FIG. 18B is a graph showing the corresponding PL spectrum measurement results for the flexible organic light-emitting display device using the dopant of FIG. 18A.

On the other hand, as shown in FIGS. 18A and 18B, the chemical structure of the boron-based dopant applied to the fourth embodiment is shown. In the case of the fourth embodiment, it may be seen that the full width at half maximum (FWHM) of the PL distribution is reduced to 28 nm due to the boron-based dopant.

Figure 19:
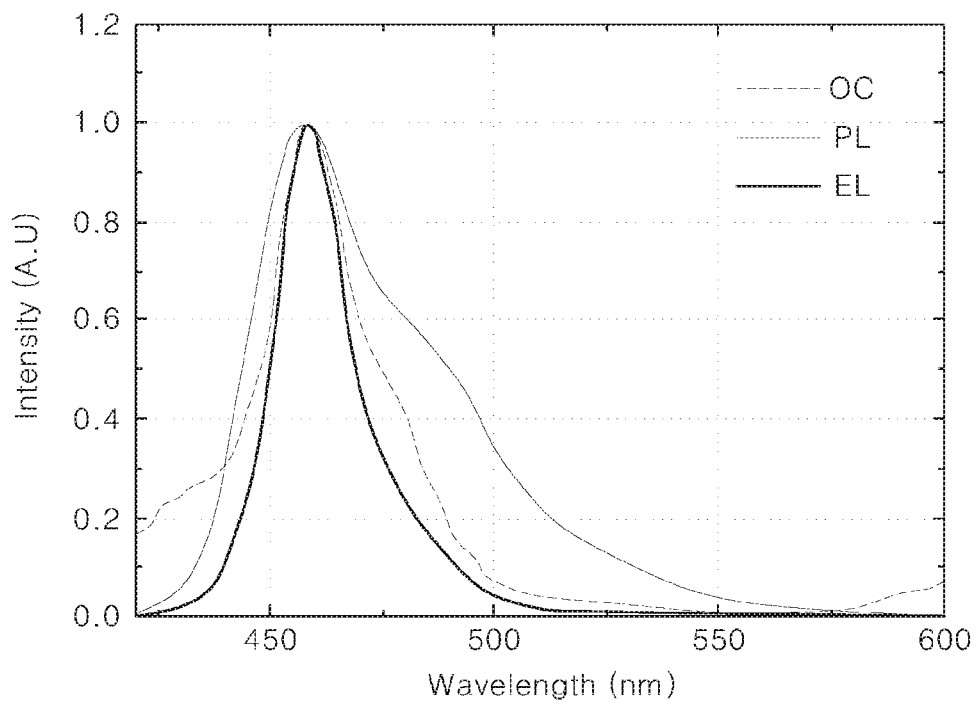
FIG. 19 is a graph showing EL, PL, and OC spectral measurements for a flexible organic light-emitting display device according to a comparison example.
Figure 20:
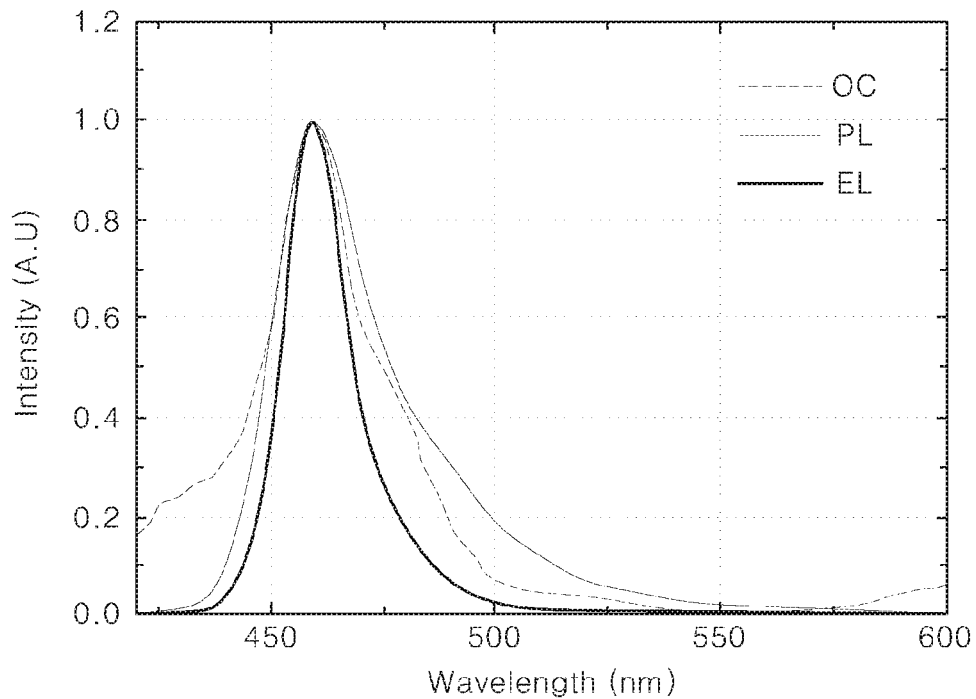
FIG. 20 is a graph showing EL, PL and OC spectra measurements for a flexible organic light-emitting display device according to the fourth embodiment.

Table 5 shows the physical properties measurements of the flexible organic light-emitting display device according to the comparison example and the fourth embodiment. Further, FIG. 19 is a graph showing EL, PL, and OC spectral measurements for a flexible organic light-emitting display device according to a comparison example. FIG. 20 is a graph showing EL, PL and OC spectra measurements for a flexible organic light-emitting display device according to the fourth embodiment.

TABLE 5

| Example | Blue @ 10 mA/cm$^2$ | | | | FWHM | | |
|---|---|---|---|---|---|---|---|
| | V | cd/A | cd/A/ CIEy | CIEx | CIEy | PL | OC | PL − OC |
| Comparison | 4.5 | 5.3 | 105.4 | 0.140 | 0.051 | 46 | 27 | 19 |
| Fourth embodiment | 4.5 | 5.7 | 123.9 | 0.139 | 0.046 | 28 | 27 | 1 |

As shown in Table 5, FIG. 19 and FIG. 20, in the case of the fourth embodiment, the light extraction efficiency cd/A is increased compared to the comparison example. This is because the PL distribution curve and the OC distribution curve are similar to each other such that the difference between the full width at half maximum of the PL distribution and the full width at half maximum of the OC distribution is 1 nm.

Figure 21:
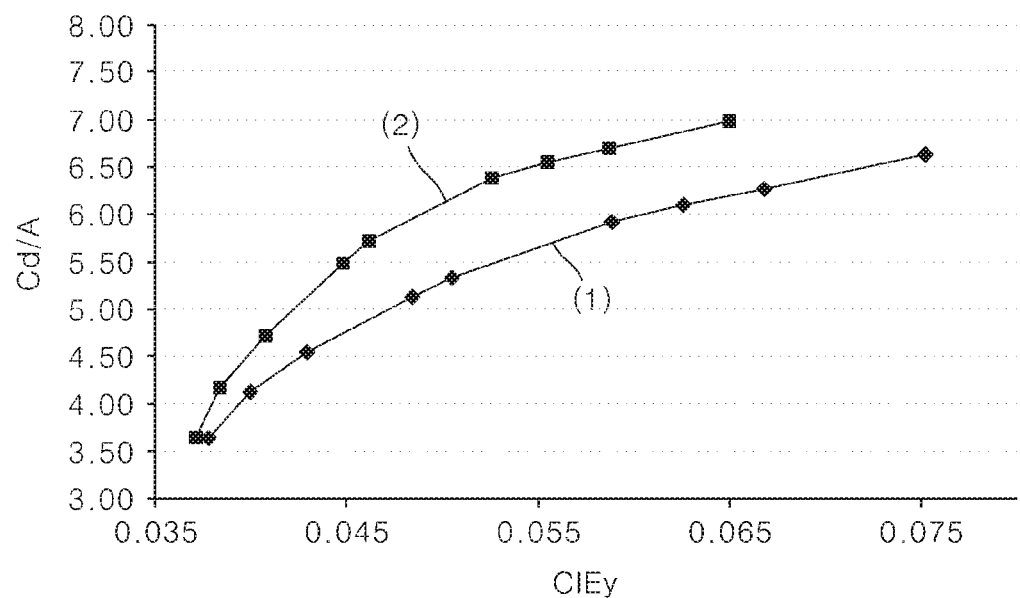
FIG. 21 is a graph showing cd/A-CIEy measurement results for a flexible organic light-emitting display device according to the fourth embodiment.
Figure 22:
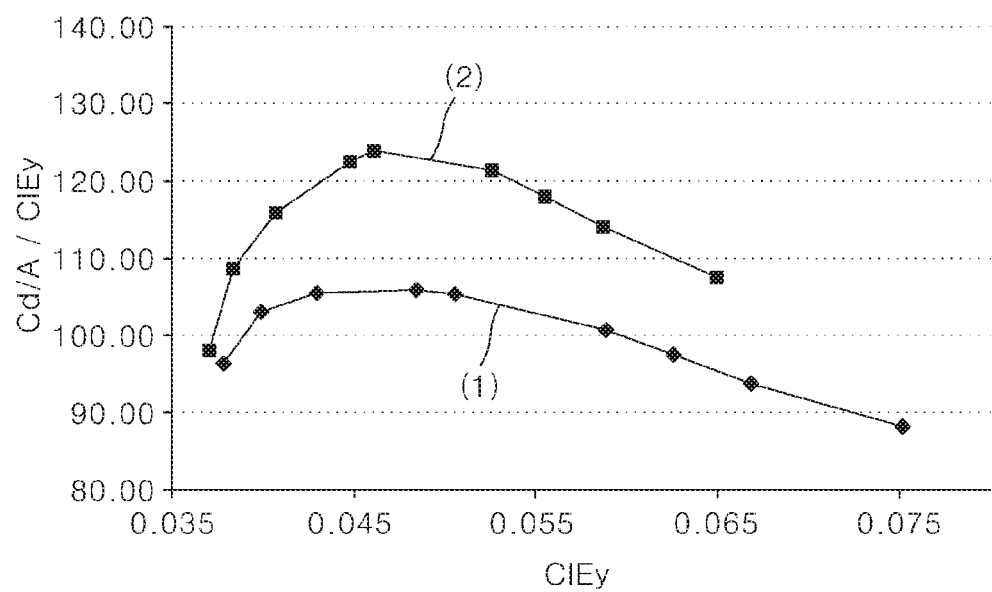
FIG. 22 is a graph showing cd/A/CIEy-CIEy measurement results for a flexible organic light-emitting display device according to the fourth embodiment.

Table 6 shows the physical properties measurements of flexible organic light-emitting display devices according to the comparison example and the fourth embodiment. Further, FIG. 21 is a graph showing cd/A-CIEy measurement results for a flexible organic light-emitting display device according to the fourth embodiment. FIG. 22 is a graph showing cd/A/CIEy-CIEy measurement results for a flexible organic light-emitting display device according to the fourth embodiment.

TABLE 6

| | Comparison (Pyrene based dopant) Blue @ 10 mA/cm$^2$ | | | | 4-th embodiment (Boron-based dopant) Blue @ 10 mA/cm$^2$ | | | |
|---|---|---|---|---|---|---|---|---|
| Example | cd/A | cd/A/ CIEy | CIEx | CIEy | cd/A | cd/A/ CIEy | CIEx | CIEy |
| HTL − 80 Å | 3.6 | 96.2 | 0.147 | 0.038 | 3.6 | 98.1 | 0.145 | 0.037 |
| HTL − 60 Å | 4.1 | 103.1 | 0.146 | 0.040 | 4.2 | 108.7 | 0.144 | 0.038 |
| HTL − 40 Å | 4.5 | 105.6 | 0.144 | 0.043 | 4.7 | 115.9 | 0.142 | 0.041 |
| HTL − 20 Å | 5.1 | 105.8 | 0.141 | 0.048 | 5.5 | 122.4 | 0.140 | 0.045 |
| Ref. HTL | 5.3 | 105.4 | 0.140 | 0.051 | 5.7 | 123.9 | 0.139 | 0.046 |
| HTL + 80 Å | 5.9 | 100.6 | 0.136 | 0.059 | 6.4 | 121.3 | 0.136 | 0.053 |
| HTL + 60 Å | 6.1 | 97.4 | 0.134 | 0.063 | 6.5 | 118.0 | 0.134 | 0.055 |
| HTL + 40 Å | 6.3 | 93.8 | 0.133 | 0.067 | 6.7 | 114.1 | 0.134 | 0.059 |
| HTL + 20 Å | 6.6 | 88.2 | 0.130 | 0.075 | 7.0 | 107.5 | 0.131 | 0.065 |

As shown in Table 6, FIG. 21 and FIG. 22, in the case of the present fourth embodiment, the light extraction efficiency based on the thickness is increased compared to the comparison example.

As may be seen from the results of the cd/A-CIEy measurement in FIG. 21 and the cd/A/CIEy-CIEy measurement in FIG. 22, the light extraction efficiency and color characteristics are improved in the present fourth embodiment compared to the comparison example.

While the foregoing is directed to the embodiments of the present disclosure, various changes and modifications may be made by those skilled in the art. Accordingly, it is to be understood that such changes and modifications are included within the scope of the present disclosure unless they depart from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flexible organic light-emitting display device, comprising:
    a light-emitting diode having a first electrode, an organic light-emitting layer on the first electrode, and a second electrode on the organic light-emitting layer;
    an organic capping layer on the second electrode of the light-emitting diode;
    a front sealing layer on the organic capping layer; and
    an inorganic capping layer disposed between the organic capping layer and the front sealing layer,
    wherein the organic capping layer has a first refractive index, wherein the inorganic capping layer has a second refractive index smaller than the first refractive index, wherein a difference between the first refractive index and the second refractive index is at least 0.4,
    wherein the front sealing layer includes: a first inorganic sealing film on the inorganic capping layer; an organic sealing film on the first inorganic sealing film; and a second inorganic sealing film on the organic sealing film,
    wherein the organic sealing film includes an ultraviolet-cured white ink material containing 30% to 45% by weight of a pigment dispersion, 10% to 30% by weight of a monofunctional monomer, 1% to 10% by weight of a photo-initiator, and 5% to 15 wt % of an oligomer, based on a total weight of the white ink material, and wherein the oligomer includes an acrylic oligomer including at least one of multifunctional acrylate (methacrylate), urethane acrylate, polyester acrylate, epoxy acrylate, and melamine acrylate, and polymers thereof.

2. The device of claim 1, wherein the first refractive index is in a range of 1.8 to 2.0, inclusive, and the second refractive index is in a range of 1.3 to 1.5, inclusive.

3. The device of claim 1, wherein the inorganic capping layer includes at least one selected from a group consisting of LiF, LiO, $MgF_2$, NaF, CaO, KF, $Bi_2S_3$, $Na_5Al_3F_{14}$ and $SiO_2$.

4. The device of claim 1, wherein each of the first and second inorganic sealing films has a third refractive index, the organic sealing film has a fourth refractive index smaller than the third refractive index, and a difference between the third refractive index and the fourth refractive index is at least 0.3.

5. The device of claim 4, wherein the third refractive index is in a range of 1.7 to 1.9, inclusive, and the fourth refractive index is in a range of 1.4 to 1.6, inclusive.

6. The device of claim 1, wherein each of the first and second inorganic sealing films has a thickness in a range of 0.5 to 1 μm, inclusive, and the organic sealing film has a thickness in a range of 3 to 9 μm, inclusive.

7. The device of claim 6, wherein the front sealing layer has a thickness of 10 μm or less.

8. The device of claim 1, wherein the pigment dispersion contains a white pigment, a reactive monomer and a dispersant.

9. The device of claim 8 wherein the white pigment includes at least one of titanium dioxide TiO2 and zinc oxide.

10. The device of claim 8 wherein the reactive monomer includes at least one of a trifunctional acrylate-based monomer and a bifunctional acrylate-based monomer.

11. The device of claim 1, wherein the ultraviolet-cured white ink further includes at least one of a polyfunctional monomer, a polymerization inhibitor and a surfactant.

12. The device of claim 11 wherein a total amount of the at least one of the polyfunctional monomer, the polymerization inhibitor and the surfactant is equal to or less than 10% by weight of the total weight of the ultraviolet cured white ink material.

13. A flexible organic light-emitting display device, comprising:

an organic light-emitting diode having a first electrode, an organic-light emitting stack on the first electrode, and a second electrode on the organic light-emitting stack, the organic-light emitting stack including an electron injection layer, an electron transport layer, an organic light-emitting layer, a hole transport layer, and a hole injection layer;

an organic capping layer on the second electrode of the organic light-emitting diode;

a front sealing layer on the organic capping layer; and an inorganic capping layer disposed between the organic capping layer and the front sealing layer, wherein the organic capping layer has a first refractive index, wherein the inorganic capping layer has a second refractive index smaller than the first refractive index, wherein a difference between the first refractive index and the second refractive index is at least 0.4, and the organic light-emitting layer includes red, green and blue light-emitting layers, and the blue light-emitting layer includes a host material and boron-based luminescent dopants in the host material, wherein the front sealing layer includes: a first inorganic sealing film on the inorganic capping layer; an organic sealing film on the first inorganic sealing film; and a second inorganic sealing film on the organic sealing film, wherein the organic sealing film includes an ultraviolet-cured white ink material containing 300, to 45% by weight of a pigment dispersion, 10% to 30% by weight of a monofunctional monomer, 1% to 10% by weight of a photo-initiator, and 5% to 15 wt % of an oligomer, based on a total weight of the white ink material, and wherein the oligomer includes an acrylic oligomer including at least one of multifunctional acrylate (methacrylate), urethane acrylate, polyester acrylate, epoxy acrylate, and melamine acrylate, and polymers thereof.

14. The device of claim 13, wherein the first refractive index is in a range of 1.8 to 2.0, inclusive, and the second refractive index is in a range of 1.3 to 1.5, inclusive.

15. The device of claim 13, wherein each of the first and second inorganic sealing films has a third refractive index, the organic sealing film has a fourth refractive index smaller than the third refractive index, and a difference between the third refractive index and the fourth refractive index is at least 0.3.

* * * * *